(12) United States Patent
Horita et al.

(10) Patent No.: US 9,024,386 B2
(45) Date of Patent: May 5, 2015

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventors: Katsuyuki Horita, Kanagawa (JP); Toshiaki Iwamatsu, Kanagawa (JP); Hideki Makiyama, Kanagawa (JP); Yoshiki Yamamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 121 days.

(21) Appl. No.: 13/678,103

(22) Filed: Nov. 15, 2012

(65) Prior Publication Data

US 2013/0119470 A1 May 16, 2013

(30) Foreign Application Priority Data

Nov. 16, 2011 (JP) ................. 2011-250493

(51) Int. Cl.
*H01L 21/00* (2006.01)
*H01L 29/78* (2006.01)
(Continued)

(52) U.S. Cl.
CPC ............ *H01L 29/78* (2013.01); *H01L 21/486* (2013.01); *H01L 21/84* (2013.01); *H01L 27/0207* (2013.01); *H01L 27/1203* (2013.01); *H01L 21/76895* (2013.01); *H01L 29/78654* (2013.01); *H01L 21/76897* (2013.01); *H01L 21/743* (2013.01); *H01L 21/76831* (2013.01); *H01L 29/78648* (2013.01); *H01L 2924/0002* (2013.01)

(58) Field of Classification Search
CPC ............ H01L 29/78; H01L 29/78648; H01L 21/76831; H01L 21/743; H01L 21/76897; H01L 29/78654; H01L 21/76895; H01L 27/1203; H01L 27/0207; H01L 21/84; H01L 21/486; H01L 2924/0002
USPC .................................................. 257/347, 351
See application file for complete search history.

(56) References Cited

U.S. PATENT DOCUMENTS

| 5,805,497 A | 9/1998 | Uchida |
| 2008/0203403 A1 | 8/2008 | Kawahara et al. |

(Continued)

FOREIGN PATENT DOCUMENTS

| JP | 9-266259 A | 10/1997 |
| JP | 2008-205322 A | 9/2008 |

*Primary Examiner* — Laura Menz
(74) *Attorney, Agent, or Firm* — Sughrue Mion, PLLC

(57) ABSTRACT

Characteristics of a semiconductor device are improved. A semiconductor device of the present invention includes: (a) a MISFET arranged in an active region formed of a semiconductor region surrounded by an element isolation region; and (b) an insulating layer arranged below the active region. Further, the semiconductor device includes: (c) a p-type semiconductor region arranged below the active region so as to interpose the insulating layer; and (d) an n-type semiconductor region whose conductivity type is opposite to the p-type, arranged below the p-type semiconductor region. And, the p-type semiconductor region includes a connection region extending from below the insulating layer, and the p-type semiconductor region and a gate electrode of the MISFET are connected to each other by a shared plug which is an integrally-formed conductive film extending from above the gate electrode to above the connection region.

17 Claims, 45 Drawing Sheets

(51) Int. Cl.
*H01L 21/48* (2006.01)
*H01L 21/84* (2006.01)
*H01L 27/02* (2006.01)
*H01L 27/12* (2006.01)
*H01L 21/768* (2006.01)
*H01L 29/786* (2006.01)
*H01L 21/74* (2006.01)

(56) References Cited

U.S. PATENT DOCUMENTS

2011/0188329 A1    8/2011   Kawahara et al.
2013/0020644 A1*   1/2013   Horita et al. .................. 257/351
2013/0119469 A1*   5/2013   Iwamatsu et al. ............. 257/347
2013/0119470 A1*   5/2013   Horita et al. .................. 257/347

* cited by examiner

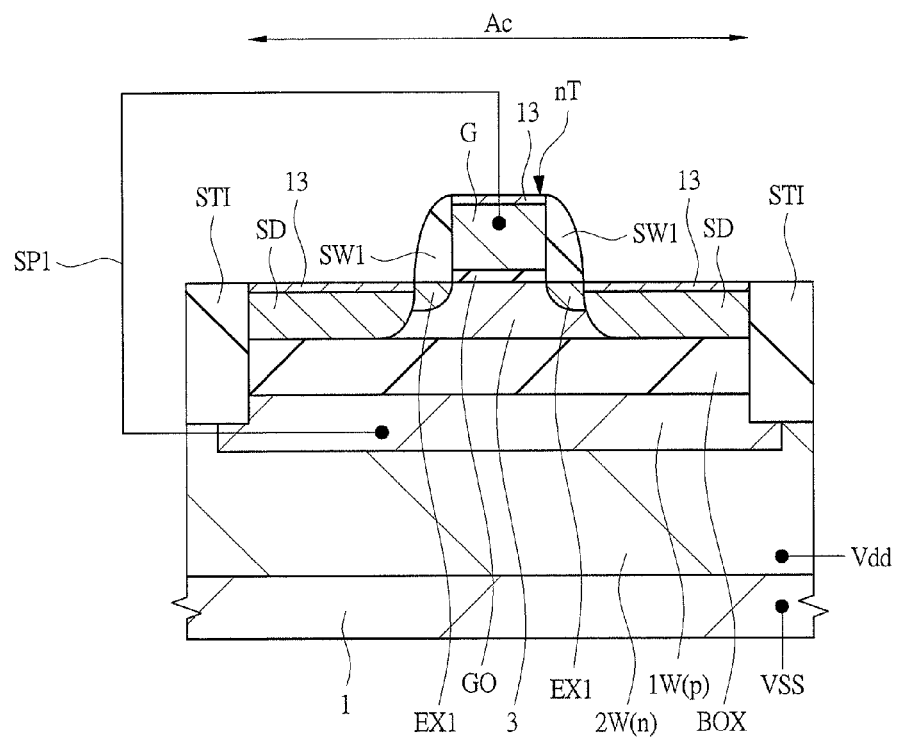

|  | on | off |
|---|---|---|
| G | O(VSS) | Vdd |
| 1W | O(VSS) | Vdd |
| 2W | O(VSS) | O(VSS) |

SEMICONDUCTOR DEVICE AND METHOD OF MANUFACTURING THE SAME

CROSS-REFERENCE TO RELATED APPLICATION

The present application claims priority from Japanese Patent Application No. 2011-250493 filed on Nov. 16, 2011, the content of which is hereby incorporated by reference into this application.

TECHNICAL FIELD OF THE INVENTION

The present invention relates to a semiconductor device. More particularly, the present invention relates to a technique effectively applied to a MISFET arranged on an SOI substrate.

BACKGROUND OF THE INVENTION

An SRAM (Static Random Access Memory) is a type of a semiconductor memory, and stores data by using a flip flop. For example, in the SRAM, data ("1" or "0") is stored in two cross-connected inverters of complementary MISFETs configured of four MISFETs. Also, two MISFETs are required for the read/write access, and therefore, a memory cell is configured of six MISFETs in a typical SRAM.

Further, in order to achieve a high performance such as low power consumption and high speed of an LSI (Large Scale Integration) including the above-described memory cell or others, employment of an SOI (Silicon On Insulator) substrate has been studied. For example, there is a technique for adjusting a threshold value of a transistor by employing a so-called double gate structure in which the SOI substrate is used for the above-described complementary MISFET (also referred to as CMOS).

For example, Patent Document 1 (Japanese Patent Application Laid-Open Publication No. 1109-266259) described below discloses an SRAM in which N-type semiconductor layers 9-1 and 9-2 are provided in a P-type semiconductor layer 1 below a buried silicon oxide film 2 of an SOI substrate and are connected to gate electrodes 12 (g1) and 12 (g2) of driving transistors T1 and T2. Moreover, it discloses a first contact hole C1 (buried plug) connected to the above-described first N-type semiconductor layer 9-1 and second N-type semiconductor layer 9-2 (see FIG. 4, paragraphs [0025] to [0035], and others).

Further, Patent Document 2 (Japanese Patent Application Laid-Open Publication No. 2008-205322) described below discloses a semiconductor integrated circuit "1" including a memory "4" and a logic circuit "5" which are embedded on a silicon substrate "2". The above-described memory includes a partially-depleted type nMOS "6" having an SOI structure formed on UTB "3", and the partially-depleted type nMOS includes a back gate region "14" to which a voltage can be applied independently from a gate terminal, below the UTB. Also, the above-described logic circuit includes fully-depleted type nMOS "7" and pMOS "8" having the SOI structure formed on the UTB, and these fully-depleted type nMOS and pMOS include back gate regions (14, 22) to which a voltage can be applied independently from a gate terminal, below the UTB. Further, this Patent Document 2 also discloses a semiconductor integrated circuit 1A in which a memory 4 formed of a partially-depleted (PD) type nMOS having the SOI structure, a logic circuit 5 formed of fully-depleted type (FD) nMOS 7 and pMOS 8 having the SOI structure, and an input protection element 50 formed of an nMOS 51 and a pMOS 52 having a bulk structure are embedded on a silicon substrate 2 (see FIG. 10, paragraphs [0044] to [0046], and others).

SUMMARY OF THE INVENTION

As described above, employment of an SOI substrate has been studied in order to achieve a high performance such as low power consumption and high speed of an LSI. Also, there is a technique for adjusting a threshold value of a transistor by employing a so-called double gate structure in which the SOI substrate is used for a complementary-type MISFET.

However, in the study of the above-described double gate structure, it is required to control a potential of a back gate region provided below an active region in which the transistor is arranged. Also, in order to control the potential of the back gate region, it is required to arrange a contact plug for electrical connection with the back gate region. As described above, it is desired to study a better device configuration including a configuration of the back gate region and the contact plug and study a method of manufacturing the same.

Accordingly, a preferred aim of the present invention is to provide a semiconductor device having good characteristics. More particularly, it is to improve the characteristics of a semiconductor device including a MISFET arranged on an SOI substrate.

Also, it is to provide a method of manufacturing the semiconductor device having the good characteristics. More particularly, it is to provide a method of manufacturing the semiconductor device having the good characteristics and including the MISFET arranged on the SOI substrate.

The above and other preferred aims and novel characteristics of the present invention will be apparent from the description of the present specification and the accompanying drawings.

In the invention disclosed in the present application, a semiconductor device to be described in a typical embodiment includes: (a) a MISFET arranged in an active region formed of a semiconductor region surrounded by an element isolation region; and (b) an insulating layer arranged below the active region. Further, the semiconductor device includes: (c) a first semiconductor region having a first conductivity type, arranged below the active region so as to interpose the insulating layer; and (d) a second semiconductor region having a second conductivity type opposite to the first conductivity type, arranged below the first semiconductor region. And, the first semiconductor region includes a connection region extending from below the insulating layer, and the first semiconductor region and a gate electrode of the MISFET are connected to each other by an integrally-formed first conductive film extending from above the gate electrode to above the connection region.

In the invention disclosed in the present application, a method of manufacturing a semiconductor device described in a typical embodiment includes: (a) a step of forming a MISFET in an active region of a substrate obtained by arranging a semiconductor region on a supporting substrate so as to interpose an insulating layer; and (b) a step of forming an opening portion by removing the insulating layer and the semiconductor region in a connection region of the substrate so as to expose the supporting substrate. Further, after the steps of (a) and (b), the method includes (c) a step of forming an integrally-formed first conductive film extending from above a gate electrode of the MISFET to the opening portion.

According to a semiconductor device described in the following typical embodiments in the invention disclosed in the present application, characteristics thereof can be improved.

Also, according to a method of manufacturing a semiconductor device described in the following typical embodiments in the invention disclosed in the present application, a semiconductor device having good characteristics can be manufactured.

BRIEF DESCRIPTIONS OF THE DRAWINGS

FIG. 1 is a schematic cross-sectional view of an n-channel-type MISFET which configures a semiconductor device of a first embodiment;

FIG. 2 is a table illustrating applied states of potentials of the n-channel-type MISFET;

FIG. 52 is a cross-sectional view of a principal part of an n-channel-type MISFET which configures a semiconductor device of a fourth embodiment as a modification example a;

DESCRIPTIONS OF THE PREFERRED EMBODIMENTS

Figure 3:
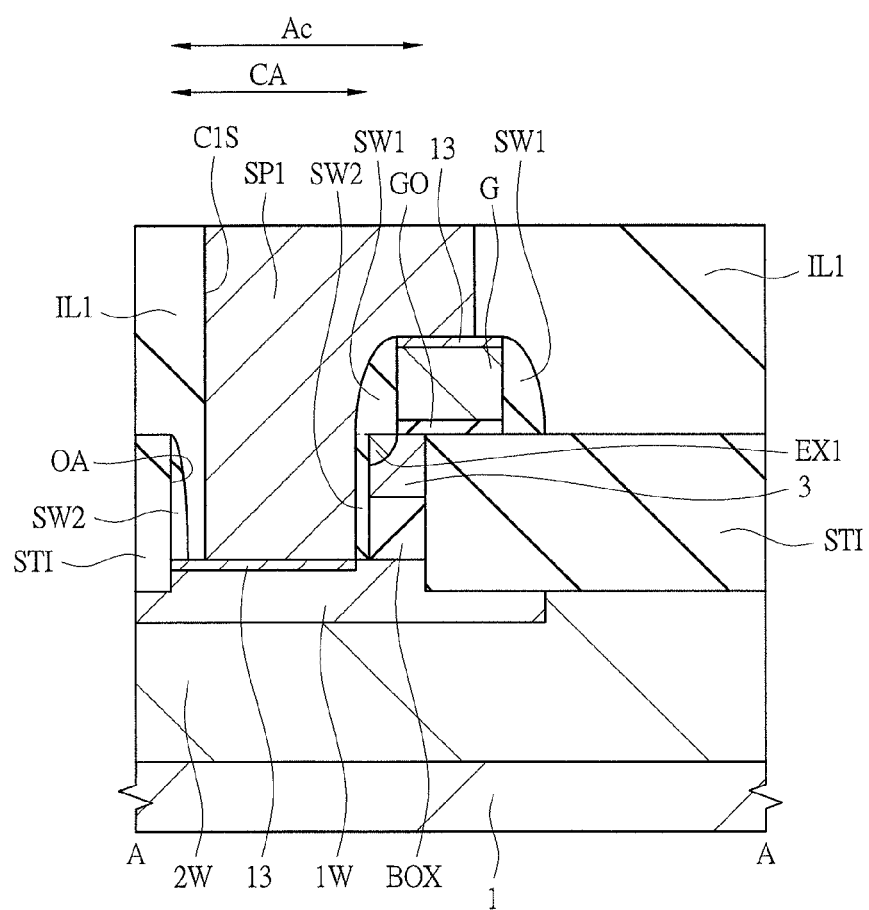
FIG. 3 is a cross-sectional view of a principal part of the n-channel-type MISFET which configures the semiconductor device of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, an application example, detailed explanation, or a supplementary explanation thereof. Also, in the embodiments described below, when referring to the number of elements or others (including number of pieces, numerical value, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components or others, positional relation thereof, and the like are mentioned, the substantially approximate and similar shapes and the like are included therein unless otherwise stated or except the case where it is conceivable that they are apparently excluded in principle. The same goes for the above-described number or others (including the number of pieces, the numerical value, the amount, the range, and the like).

Hereinafter, embodiments of the present invention will be described in detail with reference to the accompanying drawings.

Note that components having the same function are denoted by the same or related reference symbols throughout all drawings for describing the embodiments, and the repetitive description thereof will be omitted. Also, when a plurality of similar components (portions) exist, an individual or specific portion will be described by adding a symbol to a collective term in some cases. In addition, the description of the same or similar portions is not repeated in principle unless particularly required in the embodiments described below.

Also, in some drawings used in the embodiments, hatching is omitted even in a cross-sectional view so as to make the drawings easy to see in some cases. Further, hatching is used even in a plan view so as to make the drawings easy to see in some cases.

Moreover, in a cross-sectional view and a plan view, a size of each portion do not correspond to that of an actual device, but is as illustrating a specific portion to be relatively large in some cases so as to easily understand the drawings. Still further, also in a case that the plan view and the cross-sectional view correspond to each other, the size of the portion is changed for the illustration in some cases.

(First Embodiment)

A semiconductor device of the present embodiment includes an n-channel-type MISFET (NMOS). The "MISFET" is an abbreviation for Metal Insulator Semiconductor Field Effect Transistor (field effect transistor), and is sometimes called "MOS (Metal Oxide Semiconductor". Note that an n-channel-type MISFET and a p-channel-type MISFET are sometimes called "complementary-type MISFET (CMOS)".

[Explanation of Structure]

<Schematic Structure>

FIG. 1 is a schematic cross-sectional view of an n-channel-type MISFET which configures a semiconductor device of the present embodiment. FIG. 2 is a table illustrating applied states of potentials of the n-channel-type MISFET.

As illustrated in FIG. 1, the n-channel-type MISFET (nT) is formed on a main surface of a semiconductor region 3 which configures an SOI substrate. The SOI substrate includes a supporting substrate 1, an insulating layer "BOX", and a semiconductor region (element formation region) 3 above it. The supporting substrate 1 is, for example, a p-type monocrystalline silicon substrate.

This n-channel-type MISFET (nT) includes: a gate electrode "G" arranged on the semiconductor region 3 so as to interpose a gate insulating film "GO"; and a source/drain region arranged on both sides of this gate electrode G. The source/drain region has an LDD structure including an n-type low-concentration impurity region "EX1" and an n-type high-concentration impurity region "SD" whose impurity concentration is higher than that of this impurity region (EX1). Note that the source/drain region indicates a region to be a source or a drain. This source/drain region is sometimes referred to as "one end", "the other end", or others of the MISFET. Note that "13" denotes a metal silicide layer.

A p-type semiconductor region (well region, back gate region) "1W" is arranged below the semiconductor region 3, on which the n-channel-type MISFET (nT) is arranged, so as to interpose the insulating layer BOX. A bottom portion of this p-type semiconductor region 1W is positioned deeper than a bottom portion of an element isolation region "STI". Further, an n-type semiconductor region (well region, back gate region) "2W" whose conductivity type is opposite to the p-type semiconductor region 1W is arranged below this p-type semiconductor region 1W. That is, the p-type semiconductor region 1W is surrounded by the n-type semiconductor region 2W so as to form a state of pn separation. More specifically, the insulating layer BOX is positioned above the p-type semiconductor region 1W, and the bottom portion and side portions of the p-type semiconductor region 1W are arranged so as to be in contact with the n-type semiconductor region 2W. Note that a part of the side portions of the p-type semiconductor region 1W may be in contact with the element isolation region STI.

Here, in the present embodiment, the gate electrode G of the n-channel-type MISFET (nT) and the p-type semiconductor region 1W below it are electrically connected to each other. This electrical connection is achieved by a shared plug (shared contact) SP1 as explained in detail later. Also, the n-type semiconductor region 2W is fixed at a power-supply potential (Vdd, driving potential, first potential). Further, the supporting substrate 1 below the n-type semiconductor region 2W is fixed at a ground potential (VSS, reference potential, second potential, which is lower than the above-described first potential).

In this manner, the p-type semiconductor region 1W below a formation region (Ac) of the n-channel-type MISFET (nT) is electrically separated by the n-type semiconductor region 2W positioned at the bottom portion and outer periphery thereof, so that the potential of the p-type semiconductor region 1W can be individually controlled. Also, a threshold potential (Vth) can be dynamically controlled [Effect 1] by electrically connecting the gate electrode G of the n-channel-type MISFET (nT) and the above-described p-type semiconductor region 1W to each other. That is, when the MISFET is in an on state (on), the p-type semiconductor region 1W and the gate electrode are at the same potential, so that the threshold potential (Vth) can be decreased, and an on-state current can be increased. Conversely, when the MISFET is in an off state (off), the threshold potential (Vth) can be increased, and an off-state current can be decreased. In this manner, operating characteristics of the MISFET can be improved. Also, by such improvement in the characteristics, a difference between voltages (power-supply voltage, power-supply potential, driving voltage, driving potential) applied to the gate electrode and the threshold potential is substantially increased, so that low-potential driving can be achieved.

Further, by achieving the electrical connection between the gate electrode G of the n-channel-type MISFET (nT) and the p-type semiconductor region 1W by the shared plug SP1, the formation region of the n-channel-type MISFET (nT) can be downsized [Effect 2]. This will be explained in detail later (see FIGS. 3 to 6).

<Detailed Structure>

Each of FIGS. 3 to 6 is a cross-sectional view or plan view of a principal part of the n-channel-type MISFET which configures the semiconductor device of the present embodiment. A cross section illustrated in FIG. 3 corresponds to a cross section A-A of the plan view illustrated in FIG. 6, a cross section illustrated in FIG. 4 corresponds to a cross section B-B of the plan view illustrated in FIG. 6, and a cross section illustrated in FIG. 5 corresponds to a cross section C-C of the plan view illustrated in FIG. 6.

Figure 4:
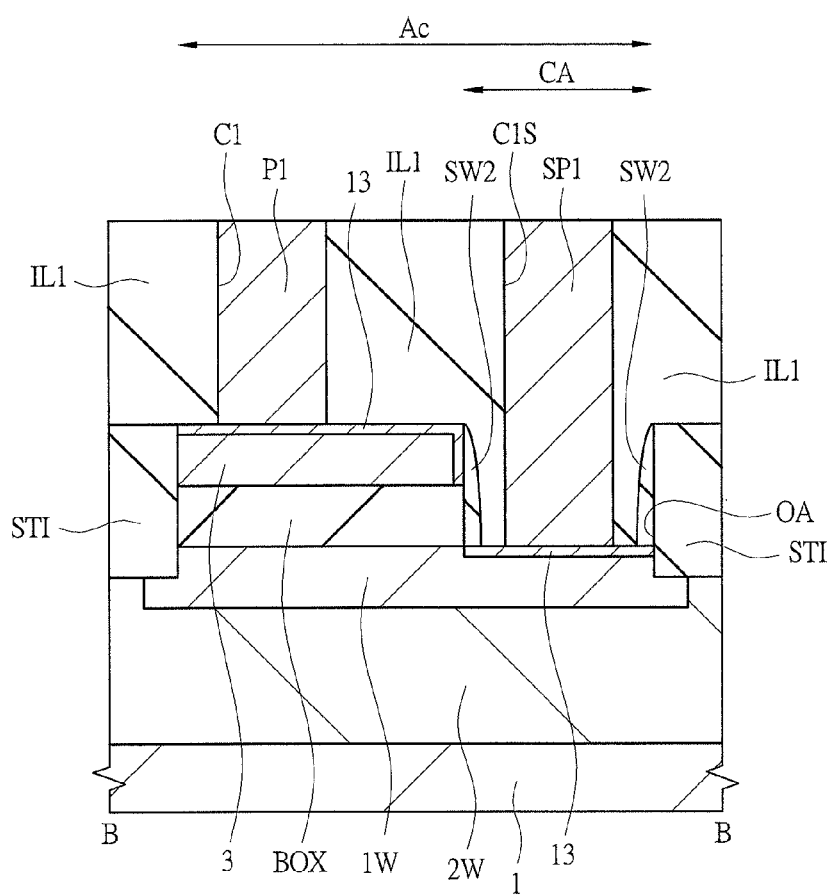
FIG. 4 is a cross-sectional view of a principal part of the n-channel-type MISFET which configures the semiconductor device of the first embodiment.
Figure 5:
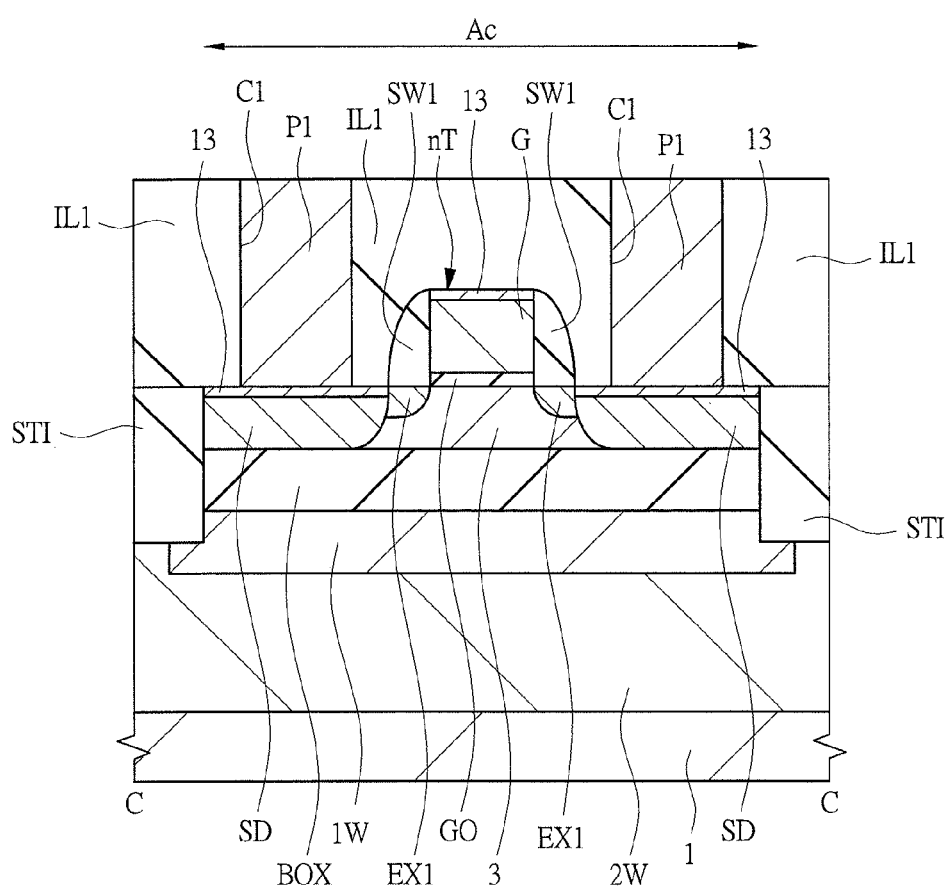
FIG. 5 is a cross-sectional view of a principal part of the n-channel-type MISFET which configures the semiconductor device of the first embodiment.
Figure 6:
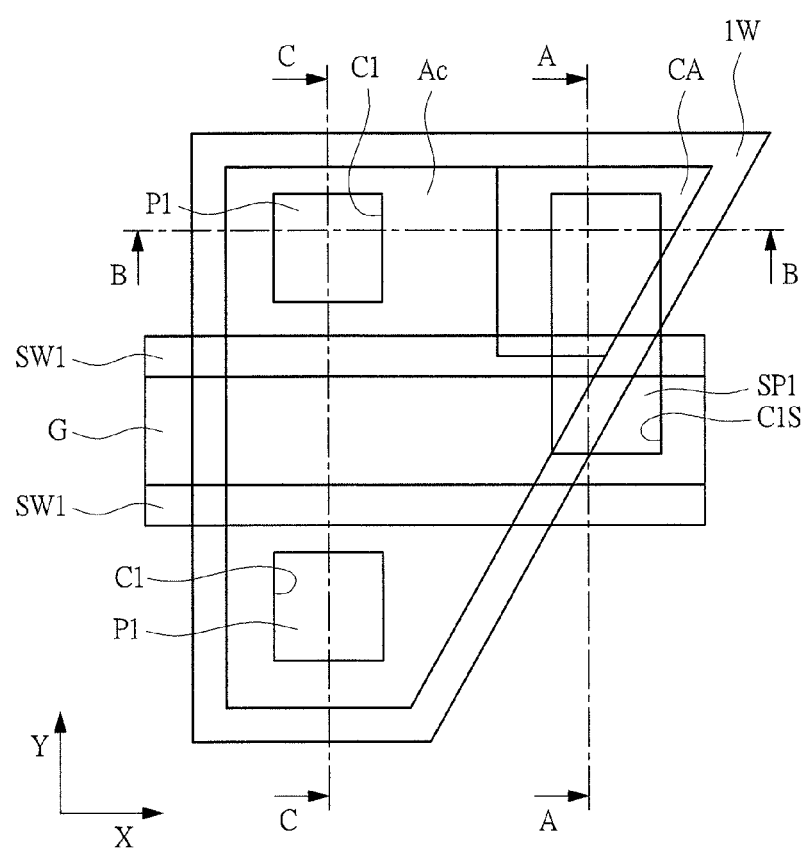
FIG. 6 is a plan view of a principal part of the n-channel-type MISFET which configures the semiconductor device of the first embodiment.

As illustrated in FIGS. 3 to 6, the n-channel-type MISFET (nT) of the present embodiment is arranged in an active region Ac which is formed of the semiconductor region 3 surrounded by the element isolation regions STI. A pattern of this active region Ac (a shape thereof in plan view from a top surface thereof) has a wide portion (triangular region) as illustrated in FIG. 6. More specifically, the pattern of the active region Ac has a trapezoidal shape which is a shape of composition of rectangle and triangle (see FIGS. 6 and 11).

This n-channel-type MISFET (nT) includes: the gate electrode G arranged on the semiconductor region 3 so as to interpose the gate insulating film GO; and the source/drain region arranged on both sides of this gate electrode G. This source/drain region has the LDD structure having the n-type low-concentration impurity region EX1 and the n-type high-concentration impurity region SD (FIG. 5).

The p-type semiconductor region 1W is arranged below this active region Ac so as to interpose the insulating layer BOX. Further, the n-type semiconductor region 2W is arranged below the p-type semiconductor region 1W, and these regions are separated from each other as the pn separation (FIG. 5).

The pattern of the gate electrode G has a rectangular shape extending in an X direction as illustrated in FIG. 6, that is, along an upper base (or lower base) of the trapezoidal shape.

A sidewall film (sidewall insulating film) SW1 is provided on both sides of the gate electrode G (FIGS. 5 and 6). Also, the above-described p-type semiconductor region 1W is arranged in a region slightly larger than the trapezoidal active region Ac (FIG. 6).

Figure 19:
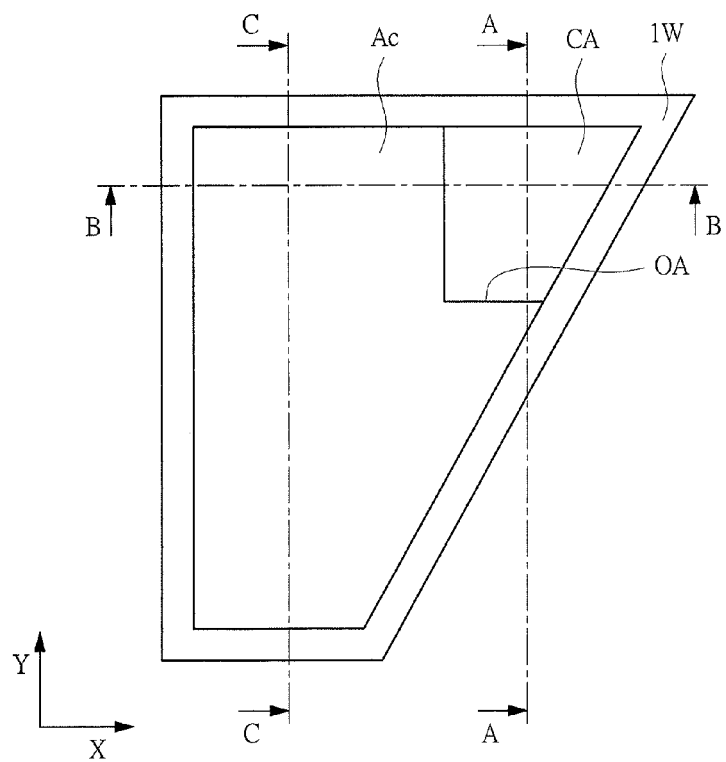
FIG. 19 is a plan view of a principal part illustrating a step of manufacturing the semiconductor device of the first embodiment, the plan view of the principal part being continued from FIG. 15.
Figure 20:
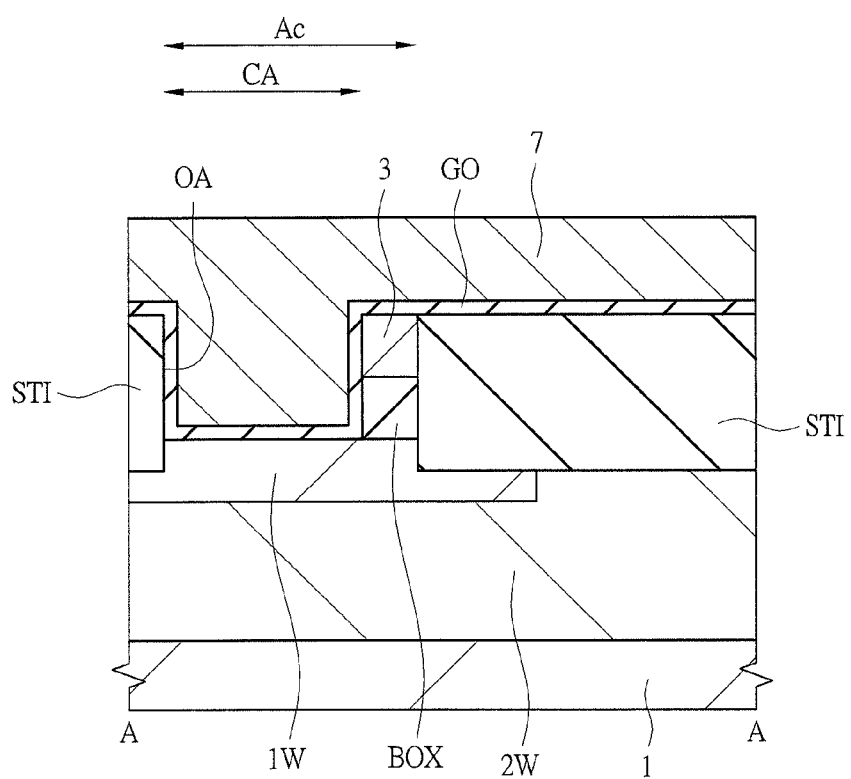
FIG. 20 is a cross-sectional view of a principal part illustrating a step of manufacturing the semiconductor device of the first embodiment, the cross-sectional view of the principal part being continued from FIG. 16.
Figure 21:
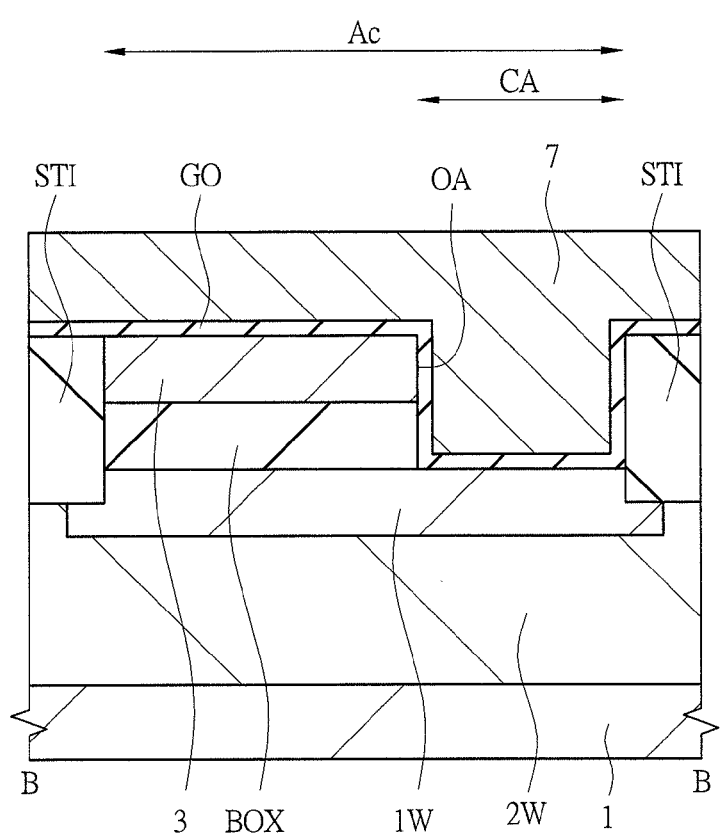
FIG. 21 is a cross-sectional view of a principal part illustrating a step of manufacturing the semiconductor device of the first embodiment, the cross-sectional view of the principal part being continued from FIG. 17.
Figure 22:
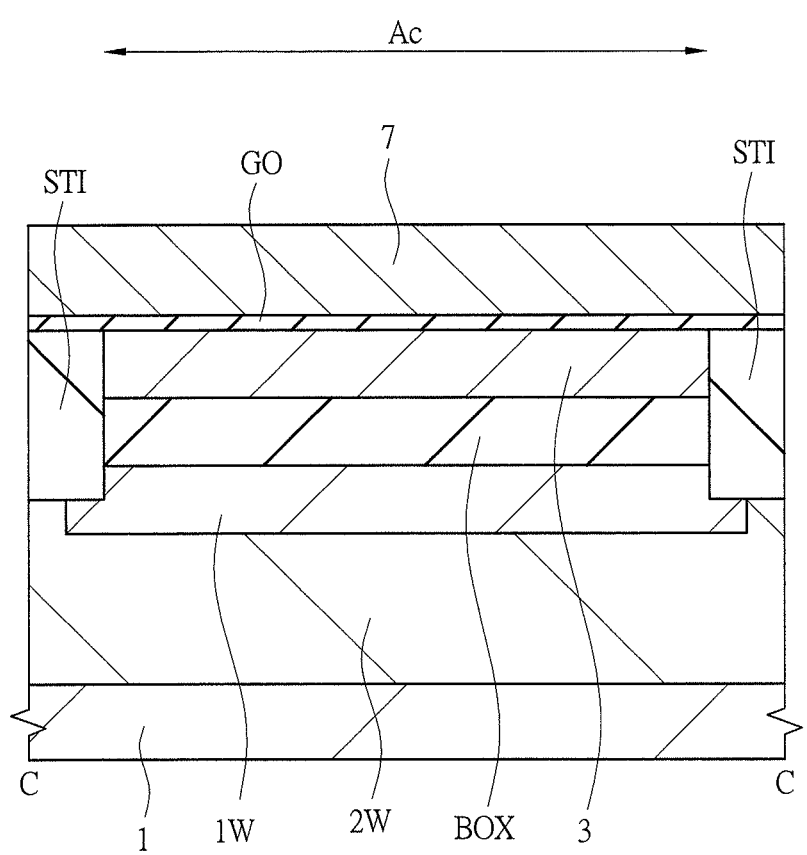
FIG. 22 is a cross-sectional view of a principal part illustrating a step of manufacturing the semiconductor device of the first embodiment, the cross-sectional view of the principal part being continued from FIG. 18.
Figure 23:
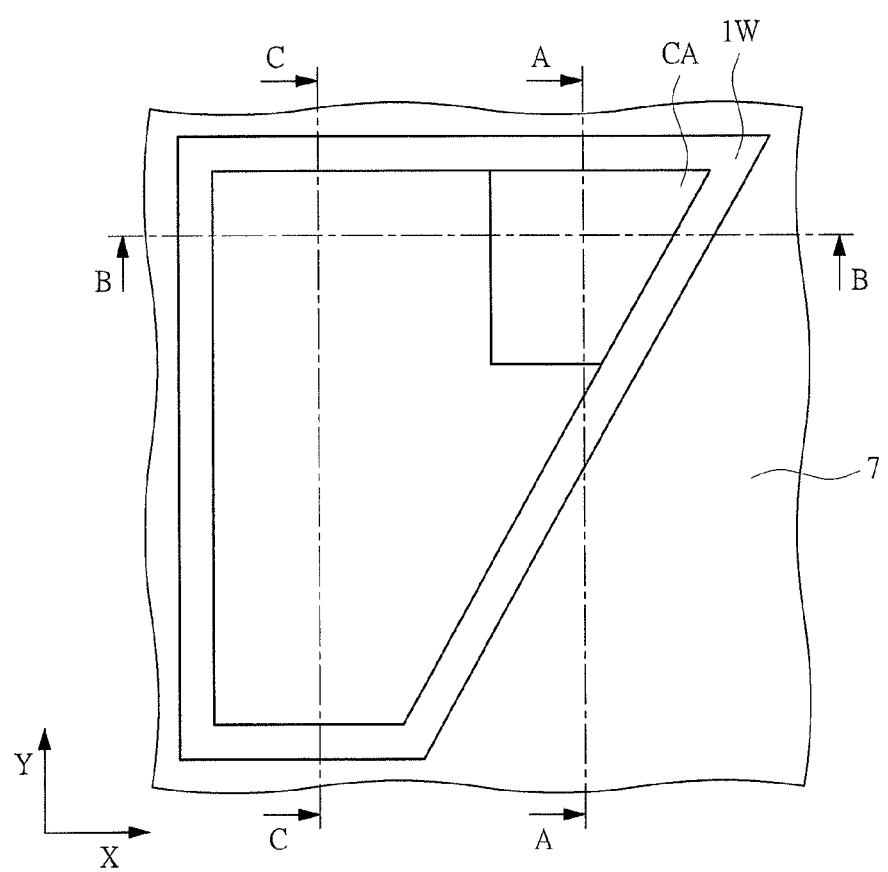
FIG. 23 is a plan view of a principal part illustrating a step of manufacturing the semiconductor device of the first embodiment, the plan view of the principal part being continued from FIG. 19.
Figure 24:
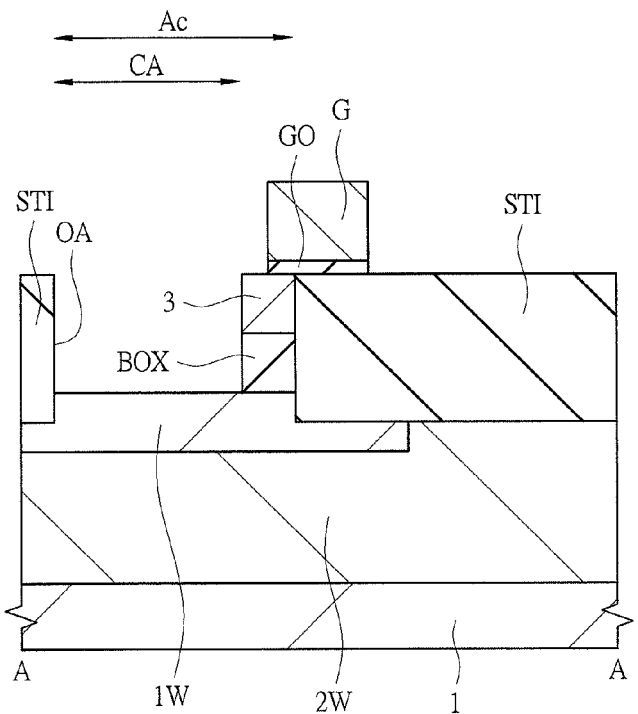
FIG. 24 is a cross-sectional view of a principal part illustrating a step of manufacturing the semiconductor device of the first embodiment, the cross-sectional view of the principal part being continued from FIG. 20.
Figure 25:
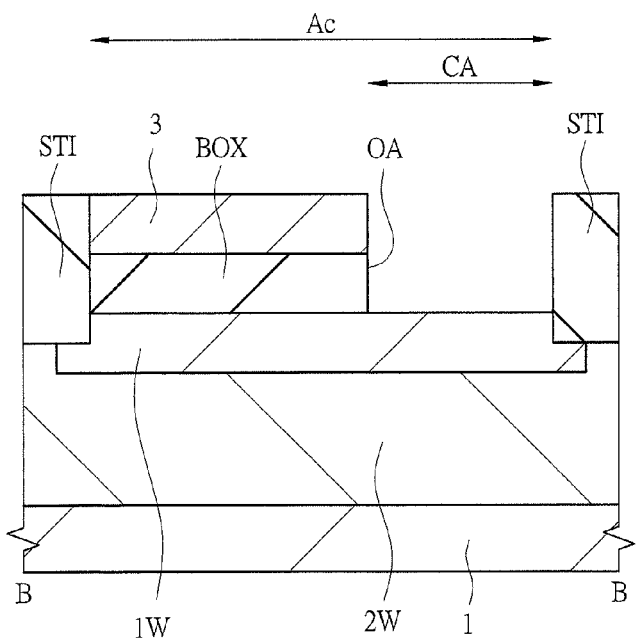
FIG. 25 is a cross-sectional view of a principal part illustrating a step of manufacturing the semiconductor device of the first embodiment, the cross-sectional view of the principal part being continued from FIG. 21.
Figure 26:
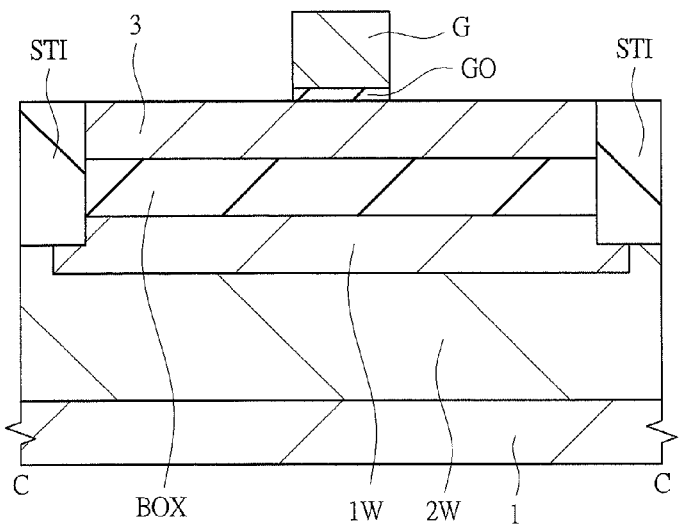
FIG. 26 is a cross-sectional view of a principal part illustrating a step of manufacturing the semiconductor device of the first embodiment, the cross-sectional view of the principal part being continued from FIG. 22.

Here, inside the pattern of the trapezoidal active region Ac, a pattern of a connection region "CA" is included (see FIGS. 6 and 19). More specifically, the pattern of the connection region CA is provided inside the wide portion (triangular region) of the active region Ac. The pattern of the connection region CA has a trapezoidal shape.

Also, as illustrated in FIG. 4, an opening portion "OA" is provided in the connection region CA. The opening portion OA is a region in which the semiconductor region 3 and the insulating layer BOX are removed, and the p-type semiconductor region 1W is arranged at a bottom portion thereof so as to interpose the metal silicide layer 13. In other words, the semiconductor region 1W includes the connection region CA extending from below the insulating layer BOX. Further, an interlayer insulating film "IL1" is buried inside the opening portion OA, and the shared plug SP1 is provided therein so as to penetrate through the interlayer insulating film IL1.

As illustrated in FIG. 3, this shared plug SP1 is provided so as to extend from above the gate electrode G to the connection region CA (opening portion OA). As illustrated in FIG. 6, the pattern of the shared plug SP1 has a rectangular shape extending in a "Y" direction from above the gate electrode G to the connection region CA (opening portion OA). At this time, an end portion (here, the lower side of the trapezoidal shape in the drawing) of the connection region CA (opening portion OA) crossed by the pattern of the shared plug SP1 is covered with the sidewall film SW1 (FIG. 3). In this manner, the shared plug SP1 and the semiconductor region 3 can be insulated from each other.

Also, a first plug P1 is provided also on the source/drain region (high-concentration impurity region SD) arranged on both sides of the gate electrode G so as to interpose the metal silicide layer 13 (FIGS. 5 and 6). Although not illustrated in FIG. 5, note that the first plug P1 is provided also on the gate electrode G so as to interpose the metal silicide layer 13 in some cases. The shared plug SP1 and the first plug P1 are provided inside a contact hole (connection hole) "C1S" and a contact hole "C1", respectively. These contact holes C1S and C1 are formed by removing the interlayer insulating film IL1. That is, the contact holes C1S and C1 can be formed in the same step. Also, the first plug P1 and the shared plug SP1 can be formed by burying these contact holes C1S and C1 with a conductive film. That is, the first plug P1 and the shared plug SP1 can be formed in the same step.

[Manufacturing Step]

Then, steps of manufacturing the semiconductor device of the present embodiment will be explained with reference to drawings, and besides, a structure of the n-channel-type MISFET of the present embodiment will be further clarified. Each of FIGS. 7 to 39 is a cross-sectional view or plan view of a principal part illustrating a step of manufacturing the semiconductor device of the present embodiment.

<MISFET Formation Step>

Figure 7:
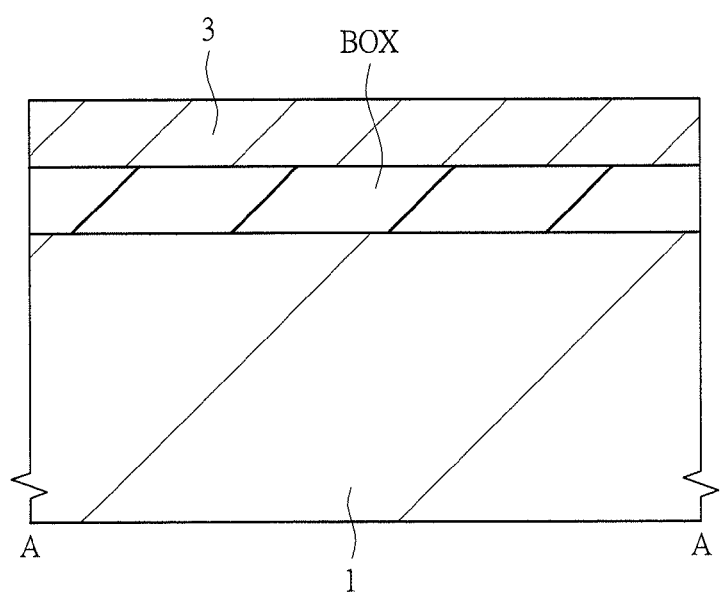
FIG. 7 is a cross-sectional view of a principal part illustrating a step of manufacturing the semiconductor device of the first embodiment.
Figure 8:
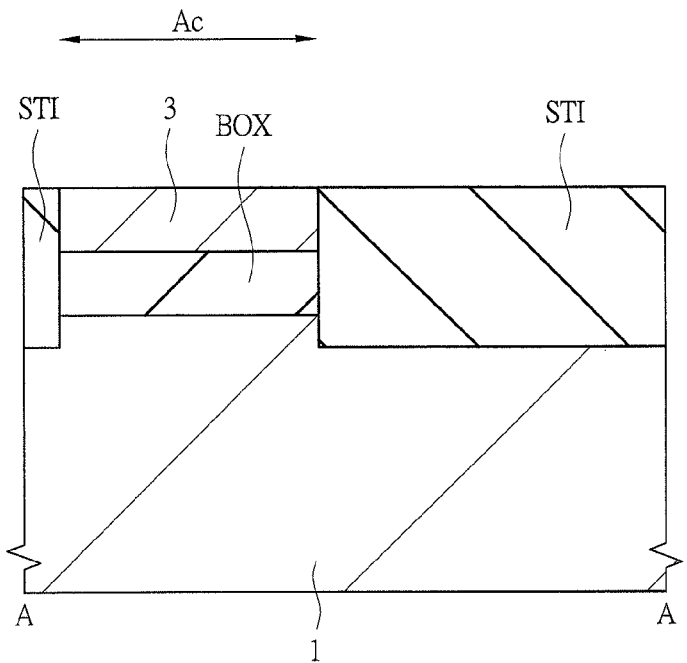
FIG. 8 is a cross-sectional view of a principal part illustrating a step of manufacturing the semiconductor device of the first embodiment.
Figure 9:
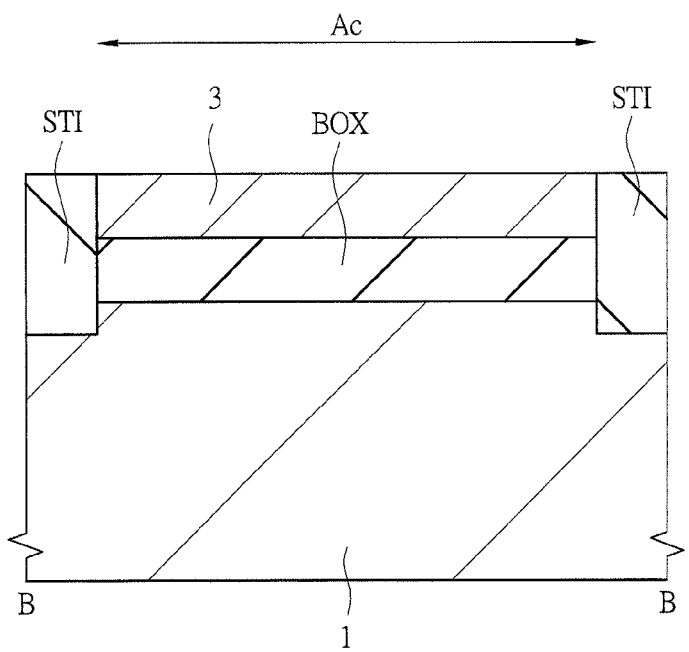
FIG. 9 is a cross-sectional view of a principal part illustrating a step of manufacturing the semiconductor device of the first embodiment.
Figure 10:
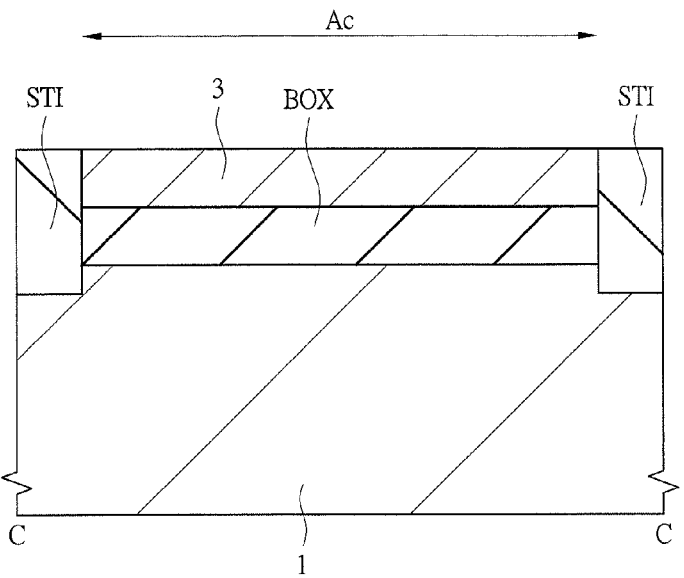
FIG. 10 is a cross-sectional view of a principal part illustrating a step of manufacturing the semiconductor device of the first embodiment.

The SOI substrate illustrated in FIG. 7 is prepared. As described above, this SOI substrate includes the supporting substrate 1, the insulating layer BOX, and the semiconductor region (element formation region) 3 above it. The supporting substrate 1 is, for example, a p-type monocrystalline silicon substrate. The insulating layer BOX is, for example, a silicon oxide film, and a thickness thereof is, for example, about 5 to 30 nm. Also, the semiconductor region 3 is, for example, a monocrystalline silicon layer (SOI layer), and a thickness thereof is, for example, about 10 to 50 nm.

Then, as illustrated in FIGS. 8 to 11, the element isolation region STI is formed inside the SOI substrate. First, a stacked film (not illustrated) formed of a silicon oxide film and a silicon nitride film serving as a hard mask is deposited on the semiconductor region 3. A thickness of the silicon oxide film is, for example, about 5 to 20 nm, and a thickness of the silicon nitride film is, for example, about 30 to 100 nm. Then, after a photoresist film which is not illustrated is deposited thereon, the photoresist film in formation regions of element isolation trenches are removed by using a photolithography technique, and then, the silicon oxide film and the silicon nitride film are etched by using an etching technique, and besides, the element isolation trenches which reach the supporting substrate 1 are formed. A depth of each of the element isolation trenches is about 200 to 600 nm from the surface of the supporting substrate 1.

Figure 11:
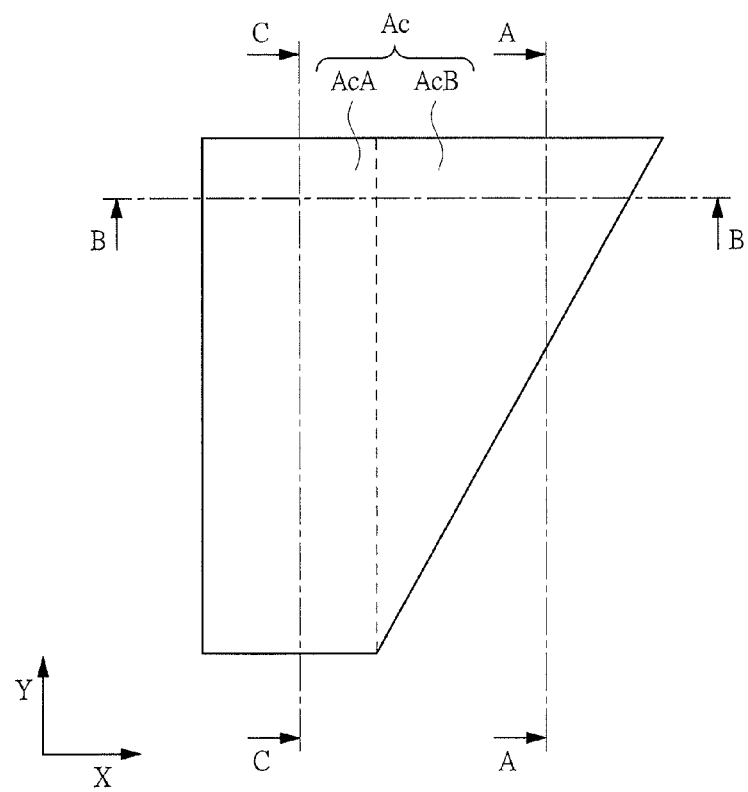
FIG. 11 is a plan view of a principal part illustrating a step of manufacturing the semiconductor device of the first embodiment.
Figure 12:
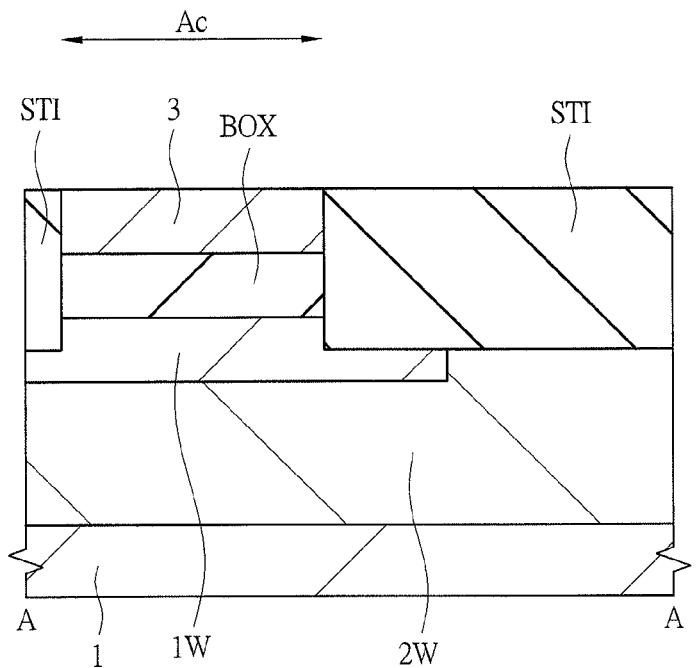
FIG. 12 is a cross-sectional view of a principal part illustrating a step of manufacturing the semiconductor device of the first embodiment, the cross-sectional view of the principal part being continued from FIG. 8.
Figure 13:
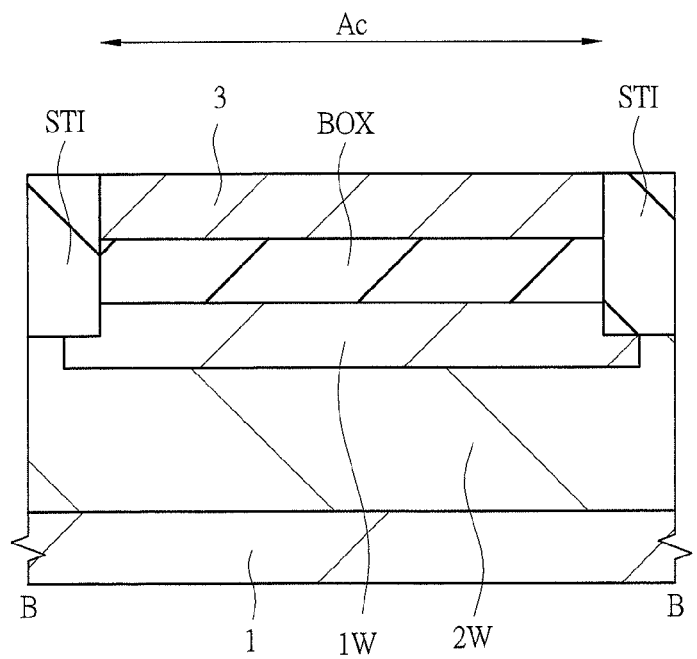
FIG. 13 is a cross-sectional view of a principal part illustrating a step of manufacturing the semiconductor device of the first embodiment, the cross-sectional view of the principal part being continued from FIG. 9.
Figure 14:
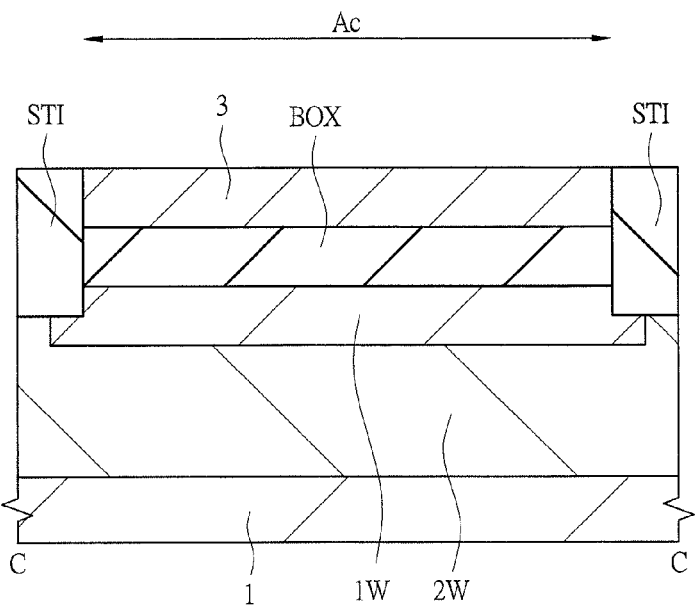
FIG. 14 is a cross-sectional view of a principal part illustrating a step of manufacturing the semiconductor device of the first embodiment, the cross-sectional view of the principal part being continued from FIG. 10.

Then, after the surface of the SOI substrate including the surfaces of the element isolation trenches is rinsed, an inner-wall oxide film (thermally-oxidized film, which is not illustrated) having a thickness of about 3 to 10 nm is formed by thermally oxidizing the surface of the supporting substrate 1 exposed from the side surfaces and bottom portion of each of the element isolation trenches. Then, an insulating film such as a silicon oxide film is formed on the SOI substrate so as to have a thickness by which each of the element isolation trenches is buried. For example, a silicon oxide film having a thickness of about 300 nm to 1000 nm is formed by using, for example, a CVD (Chemical Vapor Deposition) method or others. Then, an unnecessary silicon oxide film formed on the semiconductor substrate is removed by a chemical mechanical polishing (CMP) method. In this manner, the element isolation region STI obtained by burying the silicon oxide film inside only each of the element isolation trenches can be formed. Note that, in the step of forming the silicon oxide film, a SA-CVD (Sub-Atmospheric Chemical Vapor Deposition) method, a HDP-CVD (High Density Plasma Chemical Vapor Deposition) method, or others may be used. By using these methods, a burying performance into the element isolation trenches is improved. Also, for an element isolation trench that is fine and has a high aspect ratio, the burying performance can be further improved by arranging a film formed by the HDP-CVD method above a film formed by the SA-CVD method and using this stacked film thereof. Further, after the CMP step, flatness of a top portion of the element isolation region STI may be further improved by etching the top portion by using, for example, hydrofluoric acid or others. The semiconductor region (element formation region) 3 surrounded by the element isolation regions STI is formed by the element isolation regions STI formed in the above-described steps. The region partitioned by these element isolation regions STI is referred to as the active region Ac. As illustrated in FIG. 11, the pattern of the active region Ac (the shape thereof in plan view from the top surface thereof) has the wide portion (triangular region). More specifically, the pattern of the active region Ac has the trapezoidal shape of composition of rectangle (AcA) and triangle (AcB). This trapezoidal shape has the upper base (long side) on an upper side of the drawing and the lower base (short side) on a lower side of the drawing. Also, the upper base and the lower base are extending in the X direction.

Then, as illustrated in FIGS. 12 to 15, the semiconductor region 1W and the semiconductor region 2W whose conductivity is opposite to that of the semiconductor region 1W are formed. In this case, the semiconductor region 1W is the p-type conductivity, and the semiconductor region 2W is the n-type conductivity.

Figure 15:
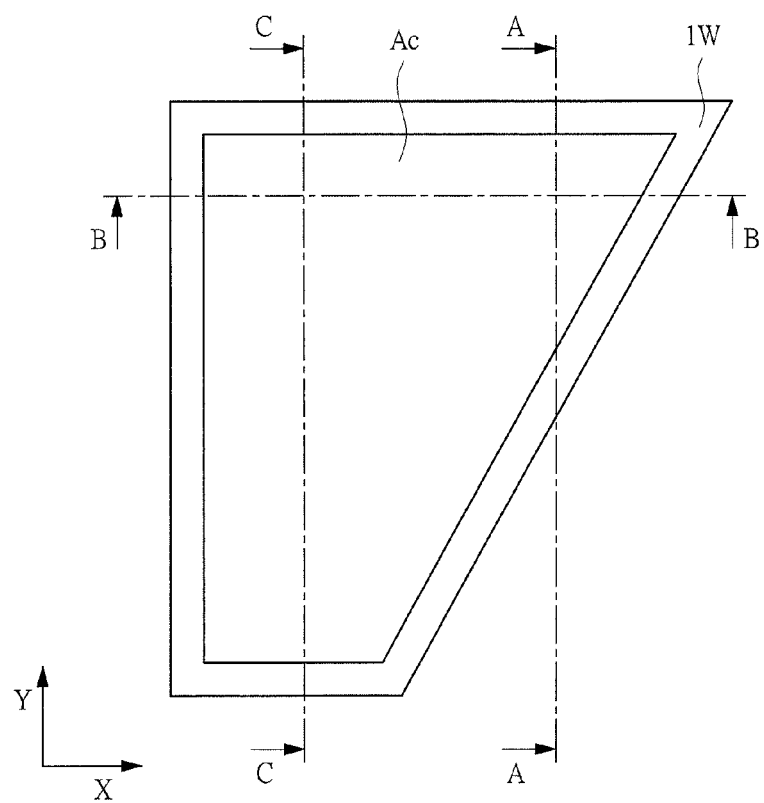
FIG. 15 is a plan view of a principal part illustrating a step of manufacturing the semiconductor device of the first embodiment, the plan view of the principal part being continued from FIG. 11.
Figure 16:
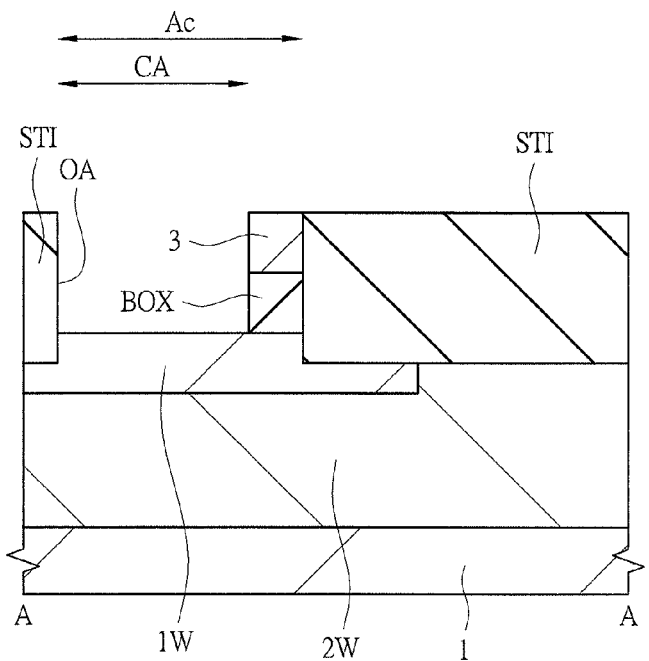
FIG. 16 is a cross-sectional view of a principal part illustrating a step of manufacturing the semiconductor device of the first embodiment, the cross-sectional view of the principal part being continued from FIG. 12.
Figure 17:
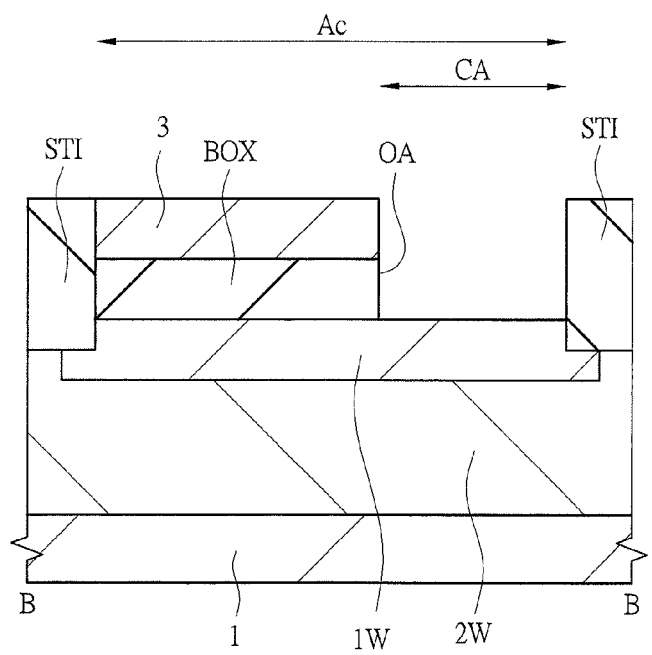
FIG. 17 is a cross-sectional view of a principal part illustrating a step of manufacturing the semiconductor device of the first embodiment, the cross-sectional view of the principal part being continued from FIG. 13.
Figure 18:
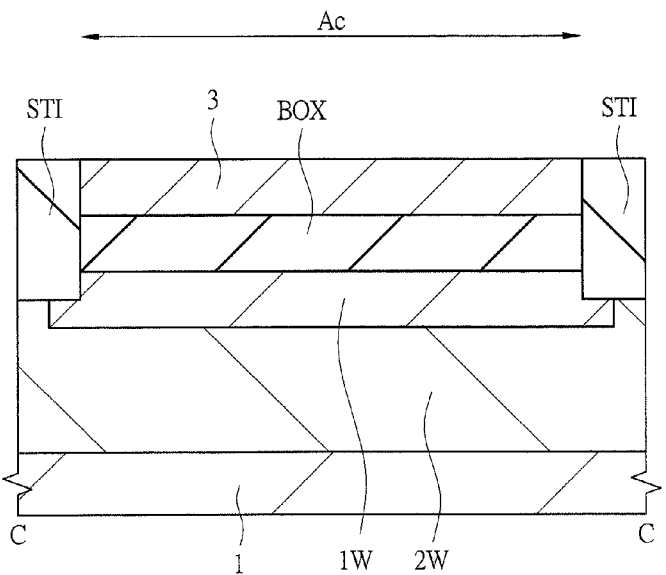
FIG. 18 is a cross-sectional view of a principal part illustrating a step of manufacturing the semiconductor device of the first embodiment, the cross-sectional view of the principal part being continued from FIG. 14.

After the above-described silicon nitride film (not illustrated) is removed by etching using hot phosphoric acid or others, an impurity is introduced (doped) into the supporting substrate 1 with using the above-described silicon oxide film (not illustrated) as a screen film. The p-type semiconductor region 1W is formed by introducing a p-type impurity (for example, arsenic or antimony) into the supporting substrate 1 by using, for example, an ion implantation method. As illustrated in FIG. 15, the pattern of the p-type semiconductor region 1W is formed in a region slightly larger than the trapezoidal active region Ac. In this case, the bottom portion of the p-type semiconductor region 1W is formed deeper than the bottom portion of the element isolation region STI.

The n-type semiconductor region 2W is formed by introducing an n-type impurity (for example, boron or indium) into the supporting substrate 1 by using, for example, the ion implantation method. At this time, the bottom portion of the n-type semiconductor region 2W is formed deeper than the bottom portion of the element isolation region STI and deeper than the bottom portion of the p-type semiconductor region 1W.

Note that it goes without saying that, in the formation by the above-described impurities, a photoresist film (mask film) is appropriately formed to prevent the introduction of the impurity into a region where the implantation of the impurity is not required. Also, by adjusting a range of the ion implantation, the impurity is then diffused, so that a semiconductor region (impurity region) having a desired depth can be formed. Note that the "range" refers to an average distance taken until the impurity is completely stopped in a substance when the impurity (ion) enters an implantation target (in this case, the supporting substrate 1). For example, when the n-type semiconductor region 2W is formed, the impurity is implanted as aiming at a position of about half of the depth of the element isolation region STI, and the impurity is diffused up and down from the above-described position by thermal treatment performed thereafter. If it is difficult to control this by performing the ion implantation once, the ion implantation may be performed a plurality of times as changing energy of the ion implantation. Also, the above-described silicon oxide film may be etched to form a new screen film.

Regarding the formation of the p-type semiconductor region 1W and the n-type semiconductor region 2W, note that either one may be formed first. Further, it is preferred that the impurities configuring the p-type semiconductor region 1W and the n-type semiconductor region 2W are controlled so as not to be implanted into the semiconductor region 3 by adjusting conditions of the ion implantation as described above. That is, it is preferred that the impurities are not implanted into the semiconductor region 3 so that a channel region of the n-channel-type MISFET (nT) is a non-doped region. For example, while an impurity for adjusting a threshold voltage may be implanted into the semiconductor region 3 (the region to be the channel), variations in transistor characteristics may be increased due to variations in the impurity concentration. On the other hand, when the channel region is the non-doped region, the variations in the transistor characteristics can be reduced.

Then, as illustrated in FIGS. 16 to 19, the above-described silicon oxide film (screen film, which is not illustrated), insulating layer BOX, and semiconductor region 3 above the supporting substrate 1 in the connection region CA in the active region Ac are removed to form the opening portion OA. For example, the silicon oxide film is removed by wet etching or others with using a photoresist film, which is not illustrated, as a mask, and then, the monocrystalline silicon layer configuring the semiconductor region 3 is removed by dry etching or others. Then, the silicon oxide film (not illustrated) remaining on the surface of the SOI substrate is removed, and besides, the insulating layer BOX exposed in the connection region CA is removed. The silicon oxide film and the insulating layer BOX in the connection region CA are removed by, for example, wet etching with using hydrofluoric acid.

As illustrated in FIG. 19, the pattern of the connection region CA (opening portion OA) is included inside the pattern of the trapezoidal active region Ac. In other words, the insulating layer BOX and the semiconductor region 3 in a part of the active region Ac are removed to form the connection region CA (opening portion OA). More specifically, the pattern of the connection region CA is provided inside the wide portion (triangular region, see FIG. 11) of the active region Ac. In this case, the pattern of the connection region CA has a trapezoidal shape.

Then, as illustrated in FIGS. 20 to 23, the gate insulating film GO is formed on the main surface of the active region (Ac). As the gate insulating film GO, for example, a stacked film formed of an insulating film such as a silicon oxide film and a high-k film (high dielectric constant film) is used. For example, a silicon oxide film having a thickness of about 0.5 nm to 1.5 nm is formed by using a thermal oxidation method. Then, as the high-k film, for example, a $HfO_2$ film (hafnium oxide film) is formed by a CVD method. A silicon oxynitride film may be used instead of the above-described silicon oxide film. Also, the gate insulating film GO may be formed of a single-layer film such as a silicon oxide film or a silicon oxynitride film, or a stacked film formed of them. Note that, in the present embodiment (FIG. 5 and others), only the formation region of the n-channel-type MISFET (nT) is illustrated. However, when other elements (such as a p-channel-type MISFET (pT) and a MISFET for high dielectric breakdown property) are formed at the same time, the configuration of the gate insulating film may be changed for each of elements to form the elements whose film thicknesses or film types are different from each other.

Then, as a material for the gate electrode G, for example, a polycrystalline silicon film 7 is deposited by a thickness of about 50 nm to 150 nm by a CVD method or others. Note that a silicon nitride film may be deposited on the polycrystalline silicon film 7 as a hard mask.

Then, as illustrated in FIGS. 24 to 27, the polycrystalline silicon film 7 is patterned to form the gate electrode G. Note that a metal film may be used as the gate electrode G. Also, the gate electrode G may be formed of a stacked film formed of a metal film and a polycrystalline silicon film thereon. In this manner, a so-called metal gate structure in which metal (including a compound with metallic electrical conductivity) is used as a gate electrode may be applied.

Figure 27:
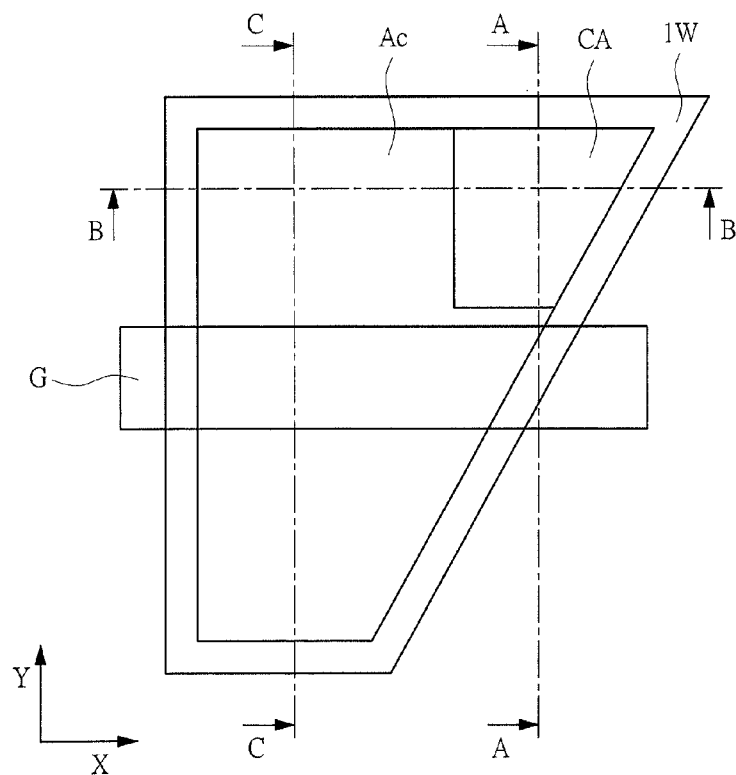
FIG. 27 is a plan view of a principal part illustrating a step of manufacturing the semiconductor device of the first embodiment, the plan view of the principal part being continued from FIG. 23.
Figure 28:
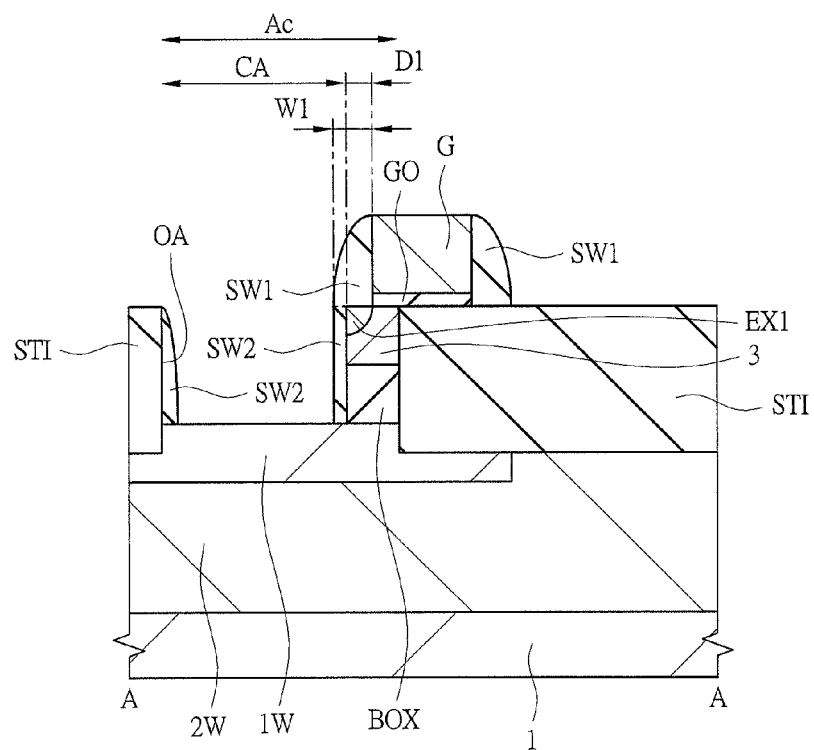
FIG. 28 is a cross-sectional view of a principal part illustrating a step of manufacturing the semiconductor device of the first embodiment, the cross-sectional view of the principal part being continued from FIG. 24.
Figure 29:
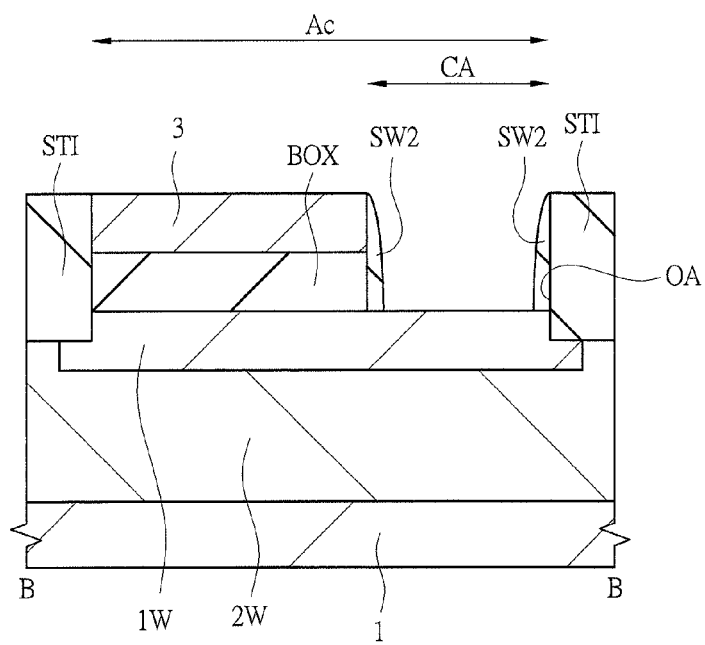
FIG. 29 is a cross-sectional view of a principal part illustrating a step of manufacturing the semiconductor device of the first embodiment, the cross-sectional view of the principal part being continued from FIG. 25.
Figure 30:
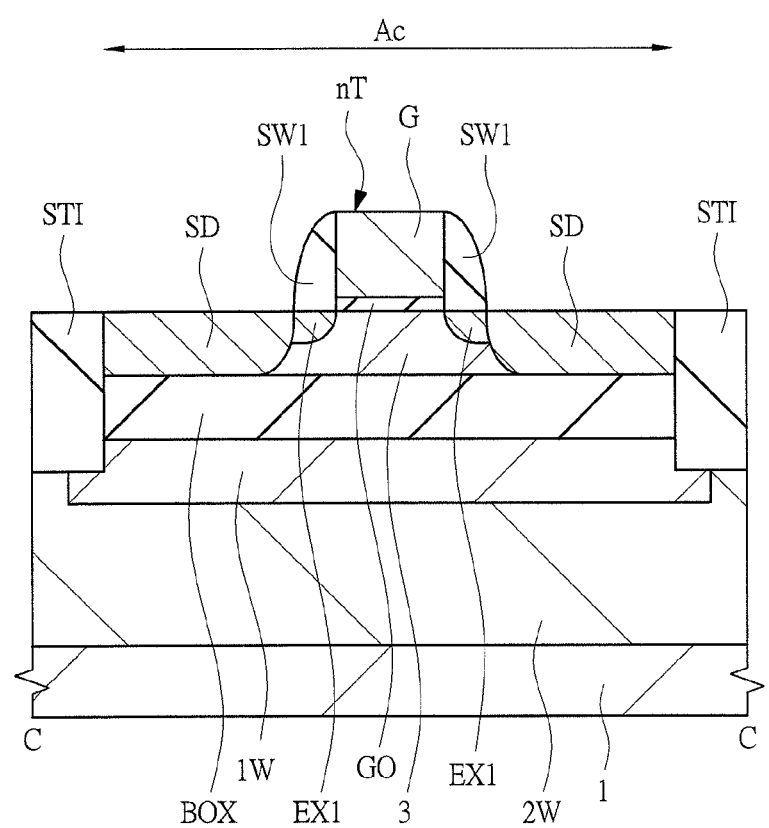
FIG. 30 is a cross-sectional view of a principal part illustrating a step of manufacturing the semiconductor device of the first embodiment, the cross-sectional view of the principal part being continued from FIG. 26.

As illustrated in FIG. 27, the pattern of the gate electrode G has a rectangular shape extending in the X direction, that is, along the upper base (or the lower base) of the trapezoidal shape. In other words, the pattern has a rectangular shape with a long side extending in the X direction. Also, the gate electrode G is formed in the vicinity of the connection region CA (opening portion OA) but formed so as not to overlap the connection region CA (opening portion OA). That is, the gate electrode G is formed on the active region Ac except for the connection region CA (opening portion OA).

Then, as illustrated in FIGS. 28 to 31, the n-type low-concentration impurity region EX1 is formed in the active region Ac on both sides of the gate electrode G. This n-type low-concentration impurity region EX1 is formed by introducing an n-type impurity into the active region Ac by an ion implantation method with using the gate electrode G as a mask.

Then, the sidewall film SW1 is formed on the side walls of the both sides of the gate electrode G. For example, an insulating film formed of a silicon oxide film and a silicon nitride film thereon is deposited on the gate electrode G by a CVD method, and then, is anisotropically etched, so that the insulating film remains on the side walls of the gate electrode G as the sidewall film SW1. Upon this etching, the sidewall film is also formed on side walls of the active region (opening portion) Ac. This sidewall film formed on the side walls of the active region (opening portion) Ac is denoted by "SW2". The side walls (exposed surfaces) of the semiconductor region 3 which configure the connection region CA (opening portion OA) are protected by this sidewall film SW2.

Figure 31:
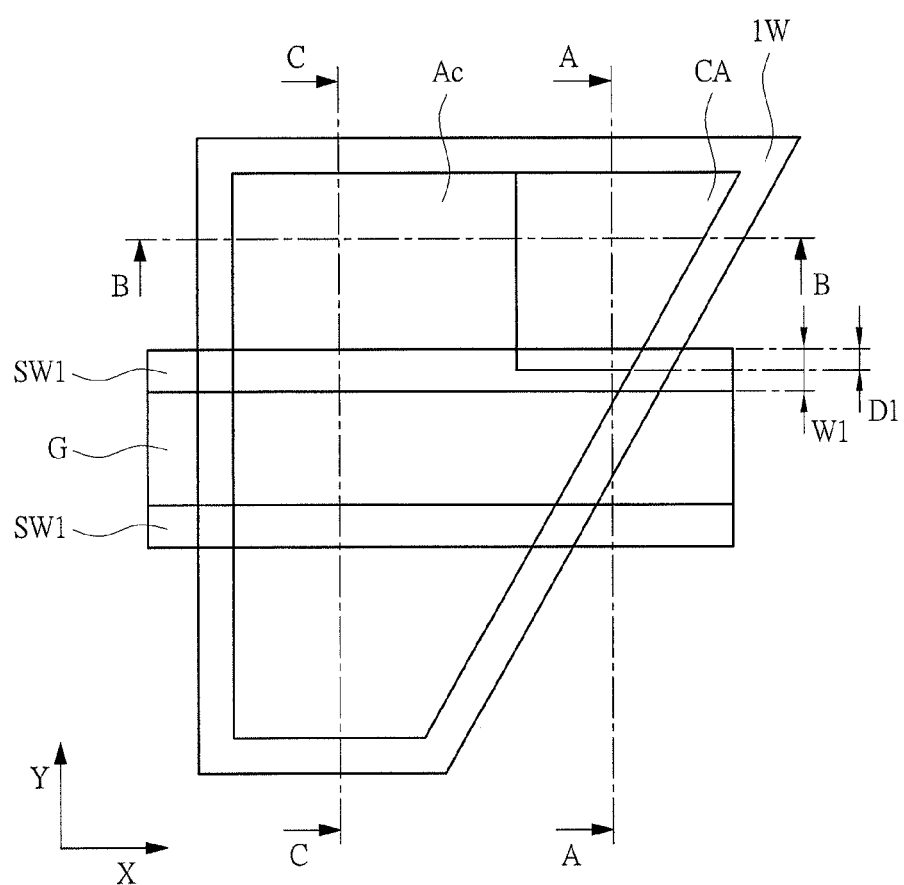
FIG. 31 is a plan view of a principal part illustrating a step of manufacturing the semiconductor device of the first embodiment, the plan view of the principal part being continued from FIG. 27.
Figure 32:
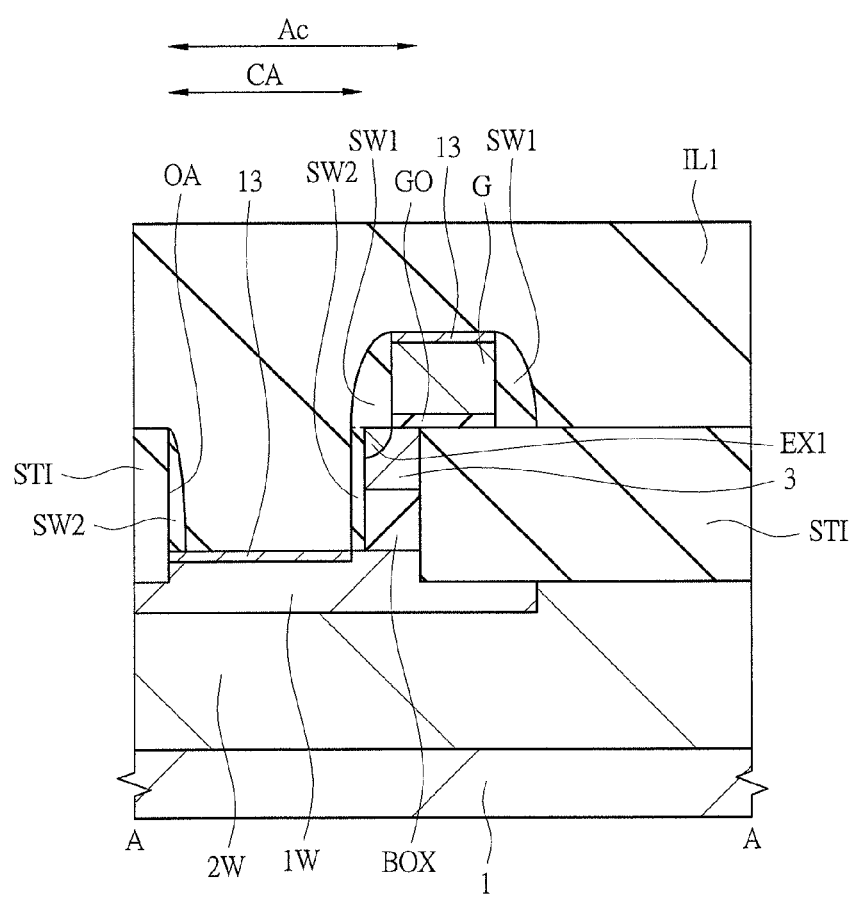
FIG. 32 is a cross-sectional view of a principal part illustrating a step of manufacturing the semiconductor device of the first embodiment, the cross-sectional view of the principal part being continued from FIG. 28.
Figure 33:
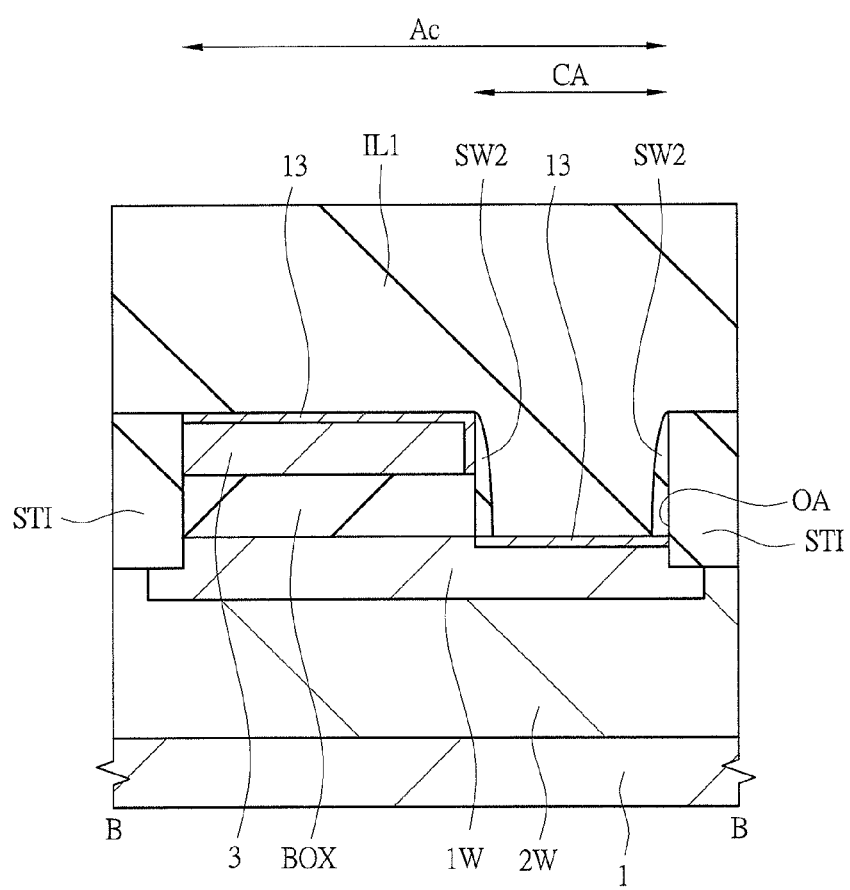
FIG. 33 is a cross-sectional view of a principal part illustrating a step of manufacturing the semiconductor device of the first embodiment, the cross-sectional view of the principal part being continued from FIG. 29.
Figure 34:
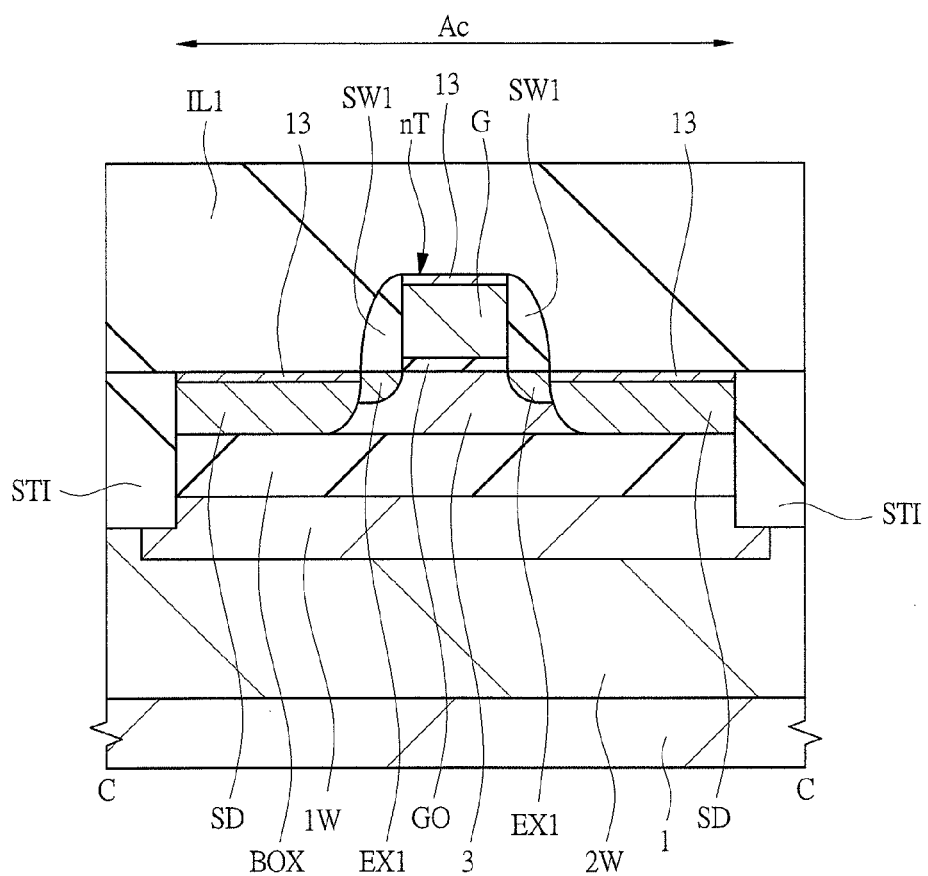
FIG. 34 is a cross-sectional view of a principal part illustrating a step of manufacturing the semiconductor device of the first embodiment, the cross-sectional view of the principal part being continued from FIG. 30.
Figure 35:
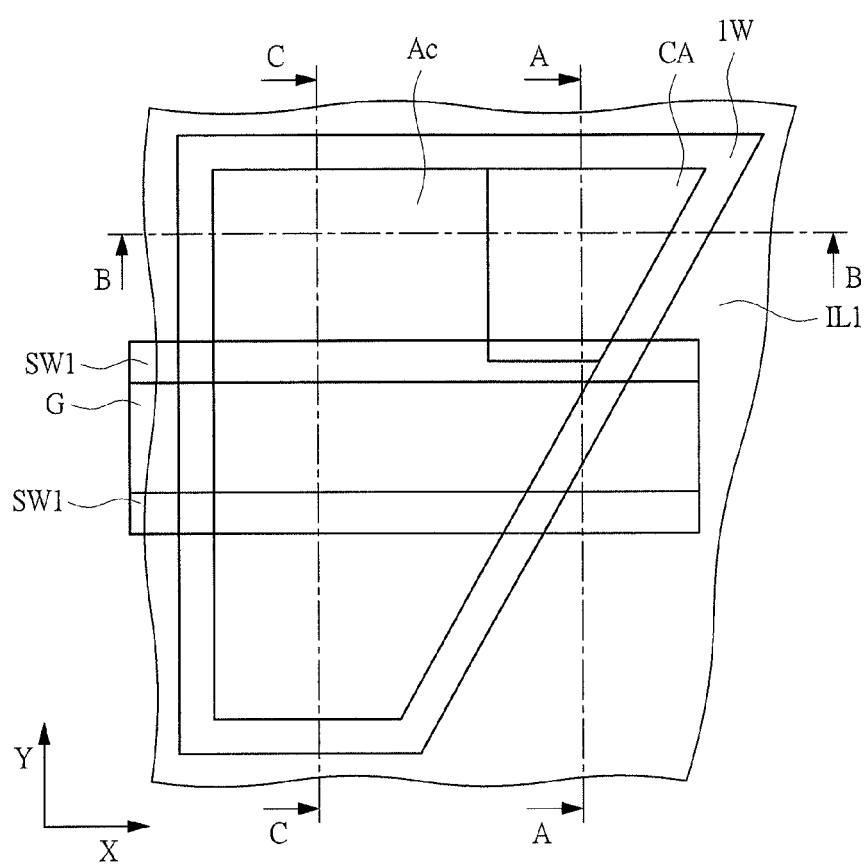
FIG. 35 is a plan view of a principal part illustrating a step of manufacturing the semiconductor device of the first embodiment, the plan view of the principal part being continued from FIG. 31.
Figure 36:
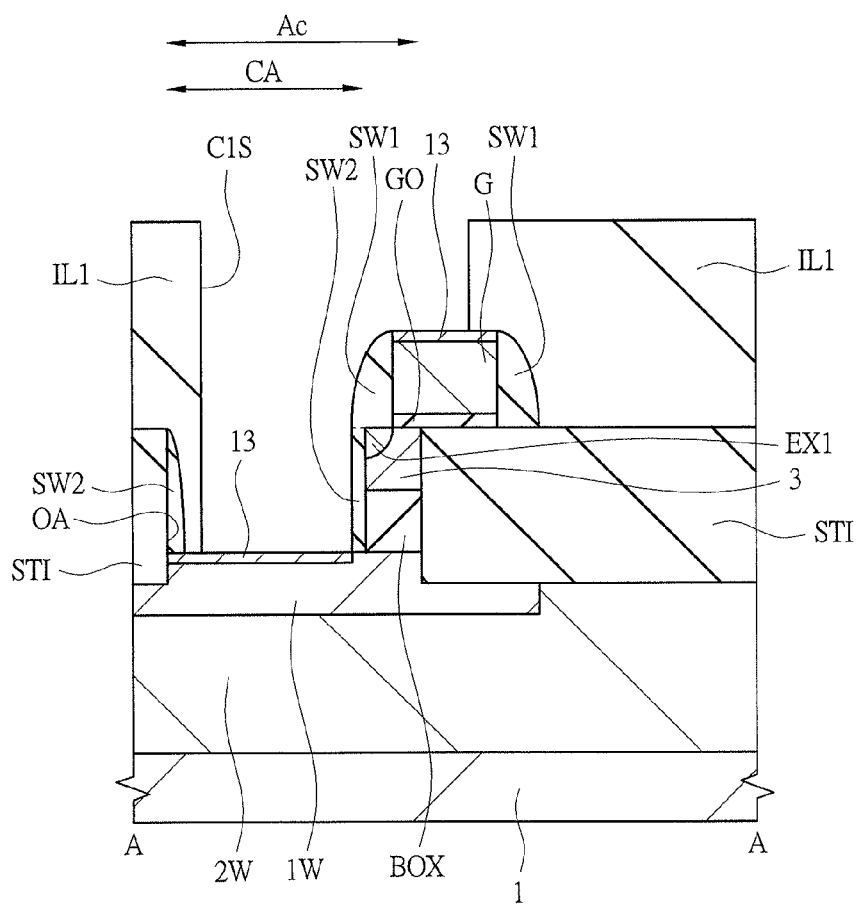
FIG. 36 is a cross-sectional view of a principal part illustrating a step of manufacturing the semiconductor device of the first embodiment, the cross-sectional view of the principal part being continued from FIG. 32.
Figure 37:
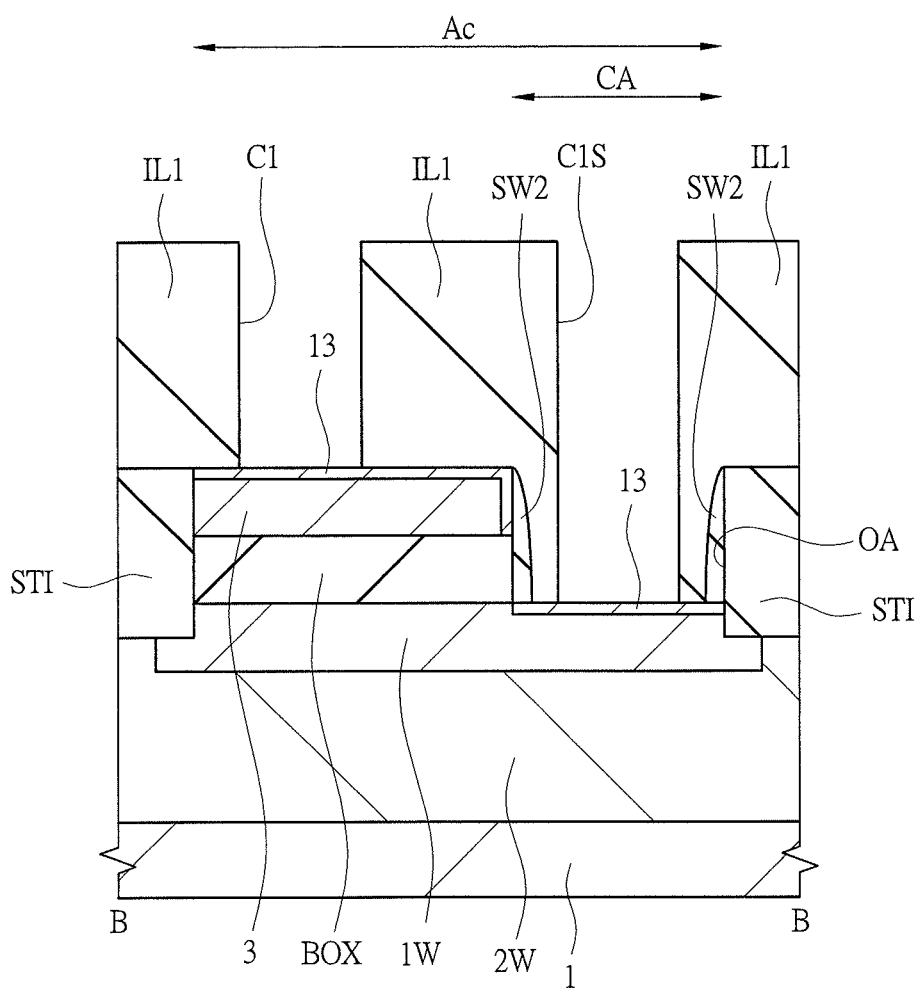
FIG. 37 is a cross-sectional view of a principal part illustrating a step of manufacturing the semiconductor device of the first embodiment, the cross-sectional view of the principal part being continued from FIG. 33.
Figure 38:
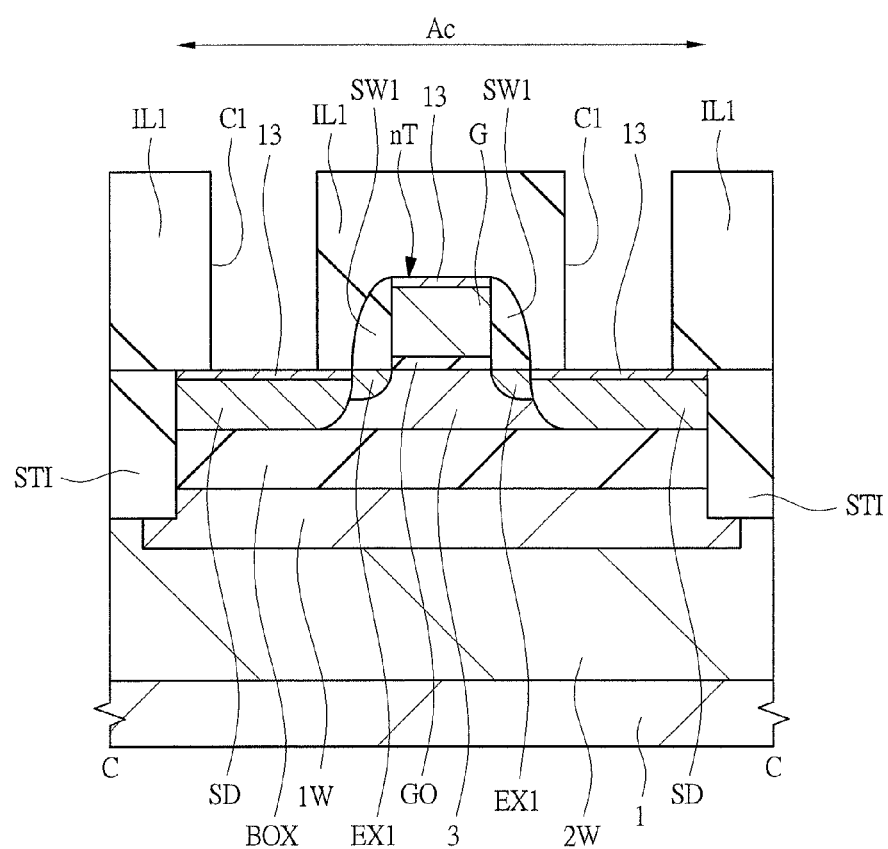
FIG. 38 is a cross-sectional view of a principal part illustrating a step of manufacturing the semiconductor device of the first embodiment, the cross-sectional view of the principal part being continued from FIG. 34.
Figure 39:
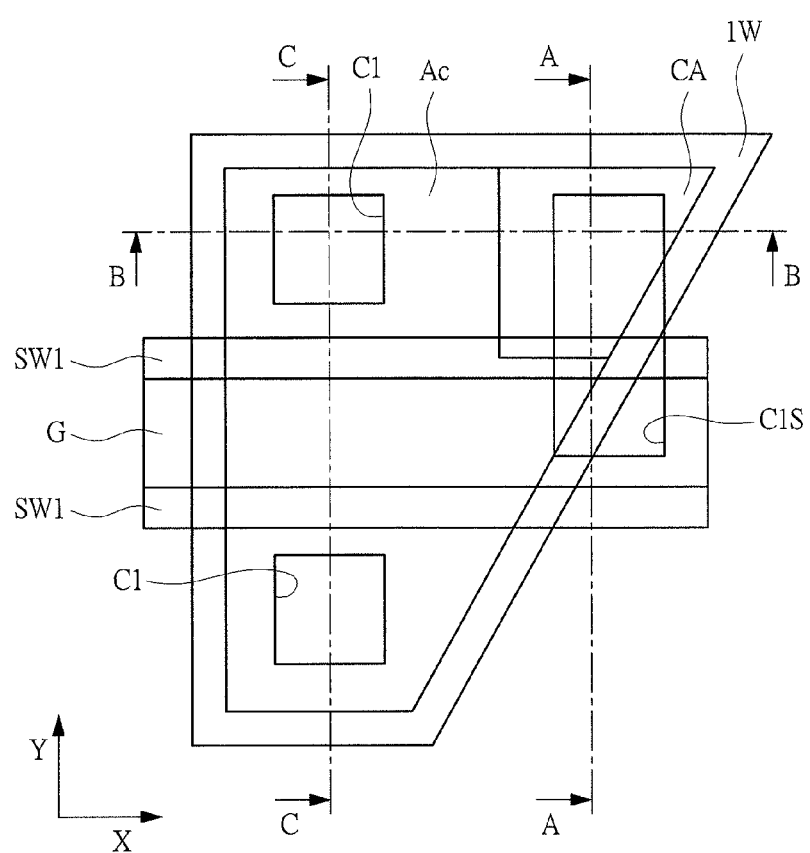
FIG. 39 is a plan view of a principal part illustrating a step of manufacturing the semiconductor device of the first embodiment, the plan view of the principal part being continued from FIG. 35.

As illustrated in FIG. 31, the pattern of the sidewall film SW1 has a rectangular shape extending along the rectangular-shaped pattern of the gate electrode G. As described above, the end portion (in this case, the lower side of the trapezoidal shape in the drawing) of the connection region CA (opening portion OA) is covered with the sidewalls (SW1 and SW2) (see FIGS. 31 and 28). In this manner, when the shared plug SP1 described later is formed across the end portion (in this case, the lower side of the trapezoidal shape in the drawing) of the connection region CA (opening portion OA), the contact of the shared plug SP1 with the semiconductor region 3 can be prevented.

Also, when the end portion of the connection region CA (opening portion OA) is covered with the sidewalls (SW1 and SW2) (see FIGS. 31 and 28), as illustrated in FIG. 31, a distance "D1" between the side wall of the active region (opening portion) Ac extending in the X direction and the gate electrode G extending in the X direction is arranged so as to be smaller than a width (thickness) "W1" of the sidewall film SW1. That is, a relation is expressed as "D1<W1". In this case, in the thickness of the sidewall film SW1, a portion having a thickness corresponding to a relation of "(W1-D1)" serves as the sidewall film SW2 which covers the side wall of the active region (opening portion) Ac (see FIG. 28). According to such a layout, the side wall (exposed surface) of the connection region CA (opening portion OA) can be covered with the sidewall film SW2 as decreasing a layout area by decreasing the distance D1.

Figure 40:
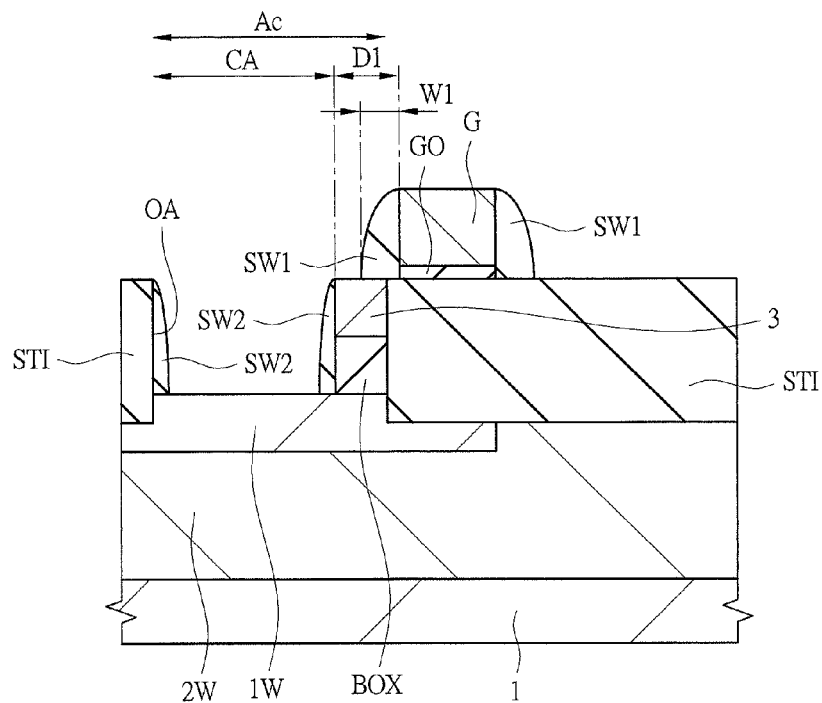
FIG. 40 is a cross-sectional view of a principal part illustrating another structure of the n-channel-type MISFET which configures the semiconductor device of the first embodiment.

Note that the layout may be configured so as to satisfy a relation of "D1≥W1". As illustrated in FIG. 40, even in the relation of "D1≥W1", the side wall (exposed surface) of the connection region CA (opening portion OA) can be covered with the sidewall film SW2 although the layout area increases. FIG. 40 is a cross-sectional view of a principal part illustrating another structure of the n-channel-type MISFET configuring the semiconductor device of the present embodiment.

Then, the n-type high-concentration impurity region SD is formed in the active region Ac on both sides of a combined body of the gate electrode G and the sidewall film SW1. This n-type high-concentration impurity region SD is formed by introducing an n-type impurity into the active region Ac by an ion implantation method with using the combined body of the gate electrode G and the sidewall film SW1 as a mask (see FIG. 30 and others).

Note that, then, the thickness of the high-concentration impurity region SD may be increased. For example, an epitaxial layer (semiconductor region, which is not illustrated) having a thickness of about 20 to 60 nm is formed on the active region Ac on the both sides of the combined body of the gate electrode G and the sidewall film SW1, that is, on the high-concentration impurity region SD, by an epitaxial growth method, and besides, an n-type high-concentration impurity region is introduced again into the active region Ac including this epitaxial layer. In this manner, a thick n-type high-concentration thick impurity region can be formed so as to expand from the epitaxial layer to the semiconductor region 3 (active region Ac). When the epitaxial layer is formed, it is preferred that the above-described hard mask is formed on the gate electrode (polycrystalline silicon film) G so that the epitaxial layer does not grow on the gate electrode G.

By the above-described steps, the n-channel-type MISFET (nT) having the LDD structure including the n-type low-concentration impurity region EX1 and the n-type high-concentration impurity region SD is substantially completed.

<First-Plug Formation Step>

Then, as illustrated in FIGS. 32 to 35, the metal silicide layer 13 is formed above the gate electrode G, the source/drain regions (SD), and others by a salicide (Self Aligned Silicide) technique, and then, the interlayer insulating film IL1 is formed.

For example, a metal film such as a nickel (Ni) film is formed on the n-channel-type MISFET (nT), and is subjected to thermal treatment, so that silicide reaction is performed in the contact regions between the gate electrode G and the Ni film and between the source/drain regions (SD) and the Ni film. Then, a non-reacted Ni film is removed, so that a nickel silicide film is formed. Note that, when the hard mask remains on the gate electrode (polycrystalline silicon film) G, the hard mask is removed, and then, the silicide reaction is performed, so that the metal silicide layer 13 can be also formed on the gate electrode G.

Then, on the channel-type MISFET (nT), for example, a stacked film formed of a silicon nitride film and a silicon oxide film is formed as the interlayer insulating film IL1. This silicon nitride film plays a role of an etching stopper upon the etching of the silicon oxide film, and is formed thinner than the silicon oxide film.

Then, as illustrated in FIGS. 36 to 39, the interlayer insulating film IL1 is etched, so that the plurality of contact holes (connection holes) C1 and C1S are formed. At this time, in the connection region CA, the metal silicide layer 13 on the p-type semiconductor region 1W is exposed on the bottom surface of the contact hole C1S. As described above, according to the present embodiment, the insulating layer BOX and the semiconductor region 3 in the connection region CA have been removed, and therefore, the contact hole C1S for the shared plug (SP1) can be formed at the same time as the other contact holes (for example, the contact holes on the source/drain regions (SD)) C1 by etching the interlayer insulating film IL1.

A contact hole may be formed on the gate electrode G in addition to the source/drain regions (SD) and the connection region CA. Also, a contact hole that reaches the n-type semiconductor region 2W or the supporting substrate 1 may be formed. The contact hole that reaches the n-type semiconductor region 2W or the supporting substrate 1 is provided in a region other than the active region Ac illustrated in FIG. 6 and others. Also in a formation region of this contact hole, the contact hole can be formed at the same time as the other contact hole C1 by previously removing the semiconductor region 3 or others. Further, the power-supply potential (Vdd) and the ground potential (VSS) are applied to the n-type semiconductor region 2W and the supporting substrate 1 via these contact hole portions, respectively.

Then, the first plugs (P1 and SP1) are formed inside the contact holes C1 and C1S, respectively (see FIGS. 3 to 6). For example, a conductive film is deposited on the interlayer insulating film IL1 including the insides of the contact holes C1 and C1S. As the conductive film, a stacked film formed of a barrier film (not illustrated) and a metal film can be used. As the barrier film, for example, a Ti (titanium) film, a TiN (titanium nitride) film, or a stacked film thereof can be used. Also, as the metal film, for example, a W (tungsten) film or others can be used. The conductive film is buried inside the contact holes C1 and C1S by removing other conductive film than the contact holes C1 and C1S of the deposited conductive film by using a CMP method or others, so that the first plugs (P1, SP1) are formed. The first plugs (P1, SP1) are the plugs connected to a first-layer wiring (not illustrated). Among them, the SP1 is called "shared plug" because the plug has a function of not only the connection with the first-layer wiring but also electrical connection between the gate electrode G and the semiconductor region (in this case, the connection region CA, that is, the p-type semiconductor region 1W).

Then, the first-layer wiring (not illustrated) is formed above the first plug P1 (including the SP1). This first-layer wiring can be formed by patterning a conductive film made of Al (aluminum) or others formed on the interlayer insulating film IL1. Also, the first-layer wiring may be formed as damascene wiring (interconnect) made of Cu (copper) or others. For example, the damascene wiring can be formed by forming wiring trenches in a wiring-trench insulating film formed on the interlayer insulating film IL1 forming a Cu film therein by a plating method or others, and removing other Cu film than the wiring trenches by a CMP method or others.

Then, multilayer wiring can be formed by further repeating the steps of forming the interlayer insulating film, the plug, and the wiring. However, in the present embodiment, detailed explanation thereof will be omitted.

<Explanation of Effect 2>

As described above, in the present embodiment, the electrical connection between the gate electrode G of the n-channel-type MISFET (nT) and the p-type semiconductor region 1W is established by the shared plug SP1, and therefore, the formation region of the n-channel-type MISFET (nT) can be decreased.

Figure 41:
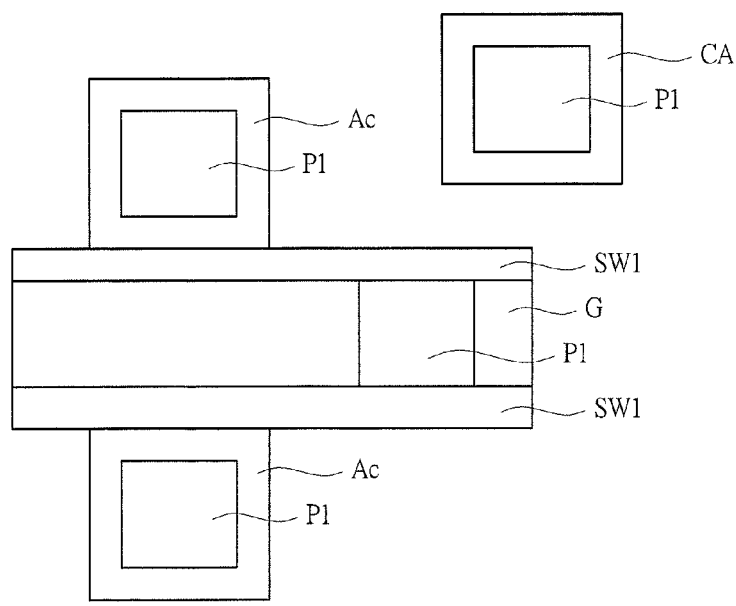
FIG. 41 is a plan view of a principal part of an n-channel-type MISFET which configures a semiconductor device of the first embodiment as a comparative example.

For example, as illustrated in FIG. 41, when the first plug P1 is individually provided on the gate electrode G and on the connection region CA above the p-type semiconductor region 1W, the formation region of the n-channel-type MISFET (nT) is increased. FIG. 41 is a plan view of a principal part of an n-channel-type MISFET which configures a semiconductor device of the present embodiment as a comparative example.

On the other hand, in the present embodiment, the formation region of the n-channel-type MISFET (nT) can be decreased by using the shared plug SP1.

(Second Embodiment)

In the first embodiment, the pattern of the active region Ac has the trapezoidal shape (see FIGS. 6 and 11). However, the shape is not limited to that shape, but may be other shapes. Hereinafter, two examples of a modification example "A" and a modification example "B" will be explained as the other shapes.

(Modification Example A)

Figure 42:
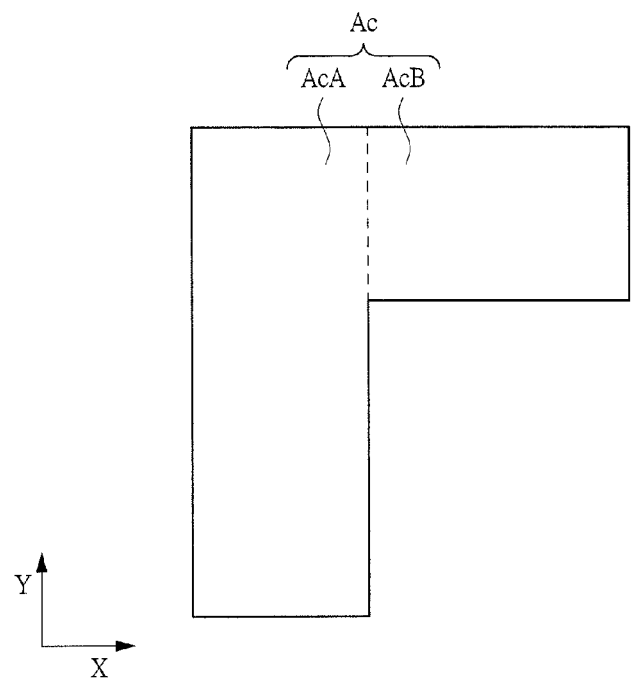
FIG. 42 is a plan view of a principal part of an n-channel-type MISFET which configures a semiconductor device of a second embodiment as a modification example A.
Figure 43:
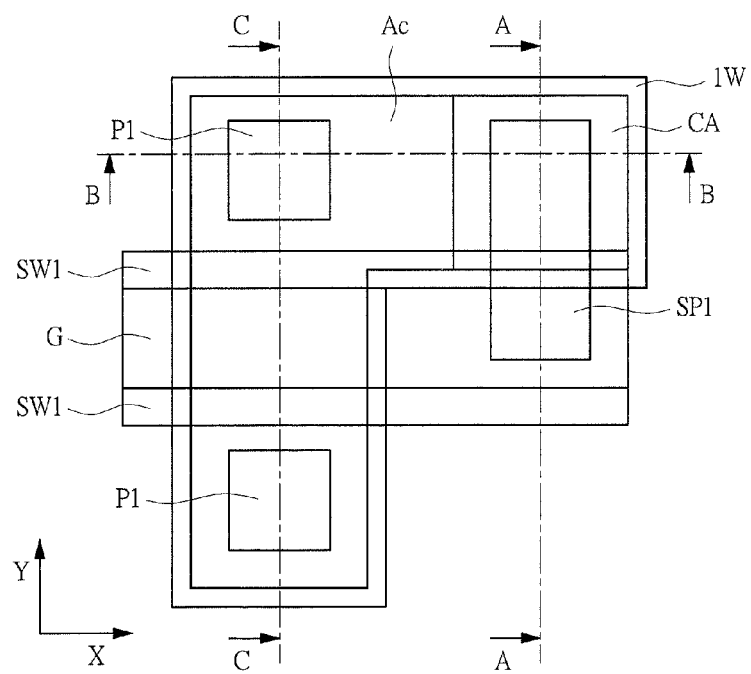
FIG. 43 is a plan view of a principal part of the n-channel-type MISFET which configures the semiconductor device of the second embodiment as the modification example A.

Each of FIGS. 42 and 43 is a plan view of a principal part of an n-channel-type MISFET which configures a semiconductor device of the present embodiment as the modification example A.

As illustrated in FIG. 42, in the semiconductor device of the present modification example A, a pattern of an active region Ac (a shape thereof in plan view from a top surface) which is formed of the semiconductor region 3 and surrounded by the element isolation regions STI is different from that of the first embodiment. More specifically, as illustrated, the pattern of the active region Ac as the present modification example A has a wide portion and a hexagonal (polygonal) shape which is a shape of composition of first rectangle "AcA" and second rectangle "AcB".

And, as illustrated in FIG. 43, a pattern of a connection region "CA" is included inside the pattern of the active region Ac, and the pattern of this connection region CA is provided inside the wide portion (a second rectangular region) of the active region Ac. The pattern of the connection region CA has a rectangular shape.

As described above, the shapes of the active region Ac and the connection region CA can be appropriately changed as long as the region (the first rectangle AcA, element formation region) where the gate electrode and the source/drain region of the n-channel-type MISFET are mainly formed and the connection region CA are provided inside the active region Ac.

Here, in the present specification, the shape of each pattern is illustrated as the rectangle or others so as to correspond to a shape of an exposure mask (original plate). However, an actual pattern becomes a pattern whose corner portion is rounded often. As described above, in a viewpoint of decreasing the layout area as taking the shape with the rounded corner portion into consideration, the pattern shape of the above-described first embodiment is preferred over that of this modification example A.

In the modification example A, note that other configurations are similar to those of the first embodiment, and therefore, the detailed explanation thereof will be omitted. For example, a cross section A-A of FIG. 43 has a similar shape to that of FIG. 3. Also, a cross section B-B of FIG. 43 has a similar shape to that of FIG. 4, and a cross section C-C has a similar shape to that of FIG. 5. Further, regarding the manufacturing steps, the formation can be made by similar steps to those of the first embodiment except for the difference in the pattern shapes of the active region Ac, the connection region CA, and others.

As described above, also in the present modification example A, the effects explained in the first embodiment (for example, the above-described Effect 1, Effect 2, and others) can be achieved.

(Modification Example B)

In the above-described first embodiment and the modification example A, the connection region CA and the region (the first rectangle AcA, the element formation region) where the gate electrode and the source/drain region of the n-channel-type MISFET are mainly formed are provided inside the pattern of one active region Ac. However, the connection region CA may be a different pattern.

Figure 44:
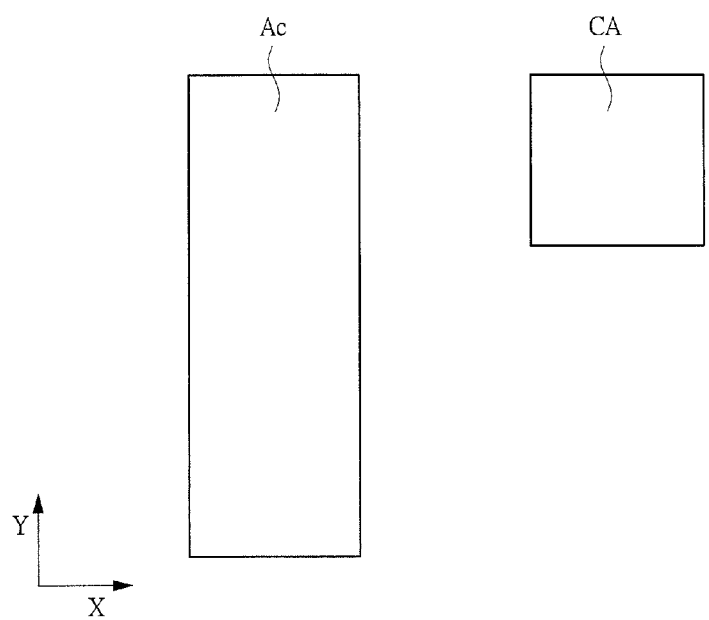
FIG. 44 is a plan view of a principal part of an n-channel-type MISFET which configures a semiconductor device of the second embodiment as a modification example B.
Figure 45:
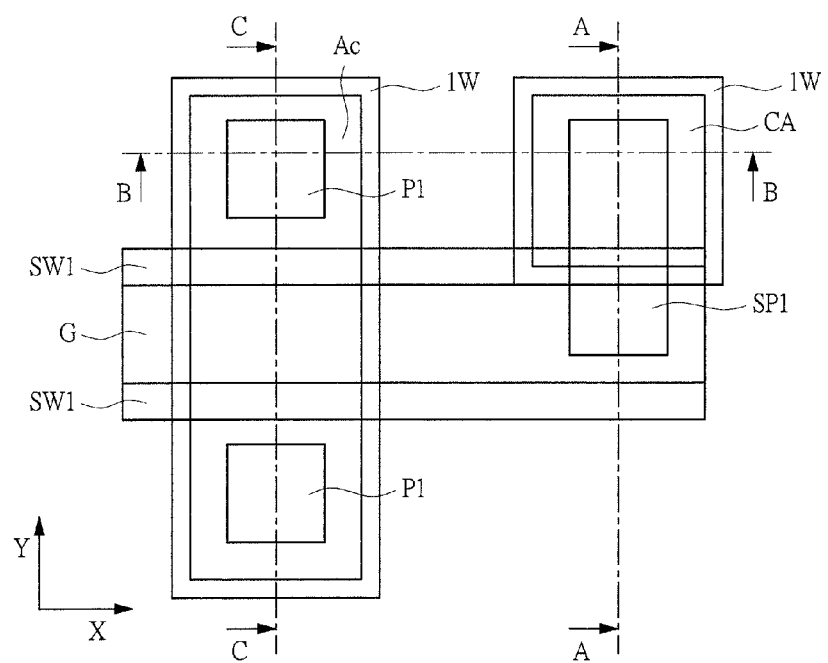
FIG. 45 is a plan view of a principal part of the n-channel-type MISFET which configures the semiconductor device of the second embodiment as the modification example B.
Figure 46:
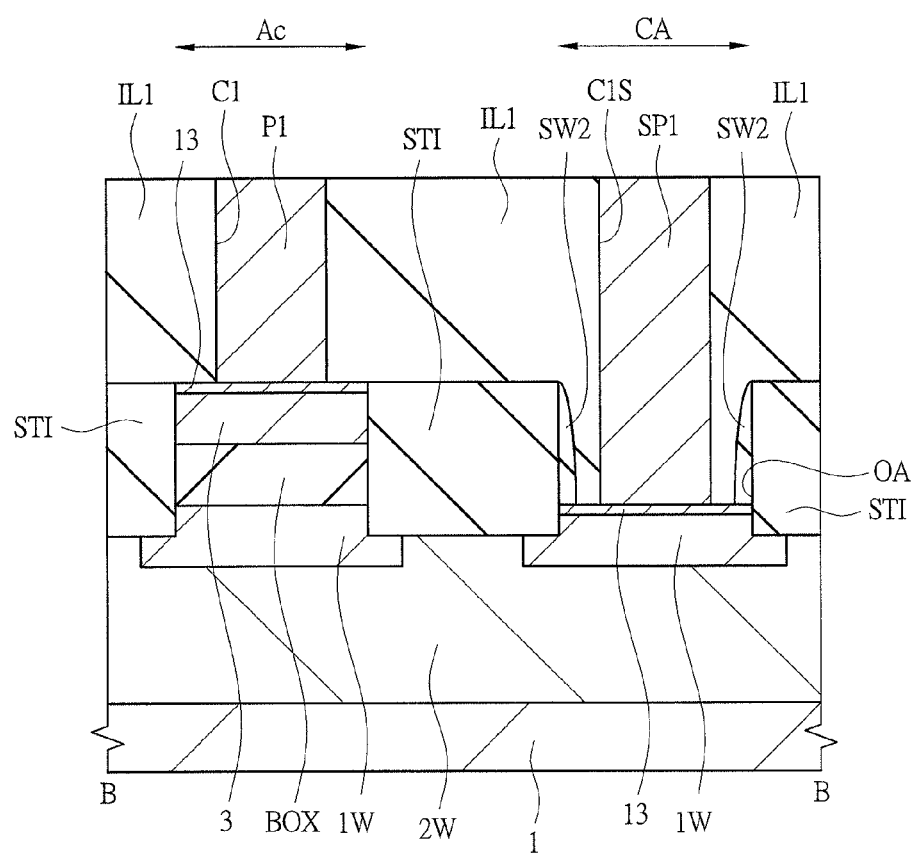
FIG. 46 is a cross-sectional view of a principal part of the n-channel-type MISFET which configures the semiconductor device of the second embodiment as the modification example B.

Each of FIGS. 44 to 46 is a plan view or cross-sectional view of a principal part of an n-channel-type MISFET which configures a semiconductor device of the present embodiment as the modification example B.

As illustrated in FIG. 44, the semiconductor device of the present modification example B includes an active region Ac surrounded by element isolation regions STI and a connection region CA surrounded by element isolation regions STI. More specifically, the pattern of the active region Ac of the present modification example B corresponds to the first rectangle AcA of the above-described modification example A, and the pattern of the connection region CA corresponds to the second rectangle AcB of the above-described modification example A. Here, in the modification example B, the first rectangle AcA and the second rectangle AcB are arranged so as to be separated from each other.

As described above, the region (the first rectangle AcA, the element formation region) where the gate electrode and the source/drain region of the n-channel-type MISFET are mainly formed may be the active region Ac, and the connection region CA may be provided as the different pattern. Obviously, as similarly to the first embodiment, the semiconductor region 3 and the insulating layer BOX are removed in this connection region CA, and the opening portion OA is arranged. As described above, other configurations are similar to those of the first embodiment, and therefore, detailed explanation thereof will be omitted. For example, a cross section A-A of FIG. 45 has a similar shape to that of FIG. 3. Also, a cross section C-C of FIG. 45 has a similar shape to that of FIG. 5. Note that, in a cross section B-B of FIG. 45, the element isolation region STI is arranged between the active region Ac and the connection region CA as illustrated in FIG. 46. While the layout area is increased by this element isolation region STI, the effects explained in the first embodiment (for example, the above-described Effect 1, Effect 2, and others) can be achieved also in the present modification example B.

Further, regarding the steps of manufacturing the semiconductor device of the present modification example B, the formation can be made by similar steps to those of the first embodiment except for the difference in the pattern shapes of the active region Ac, the connection region CA, and others.

(Third Embodiment)

In the first embodiment, the shared plug SP1 and the semiconductor region 3 are insulated from each other by covering the side wall of the opening portion OA with the sidewall film SW2 (see FIG. 3 and others). However, in the present embodiment, a sidewall film "SW3" is provided on the side wall of the contact hole C1S. Hereinafter, two examples of a modification example 1 and a modification example 2 will be explained as formation modes of the sidewall film SW3.

In the present embodiment (the modification example 1 and the modification example 2), note that configurations other than the configurations of the contact holes C1 and C1S and steps up to the formation of the contact holes C1 and C1S are similar to those of the first embodiment, and therefore, detailed explanation thereof will be omitted.

(Modification Example 1)

Figure 47:
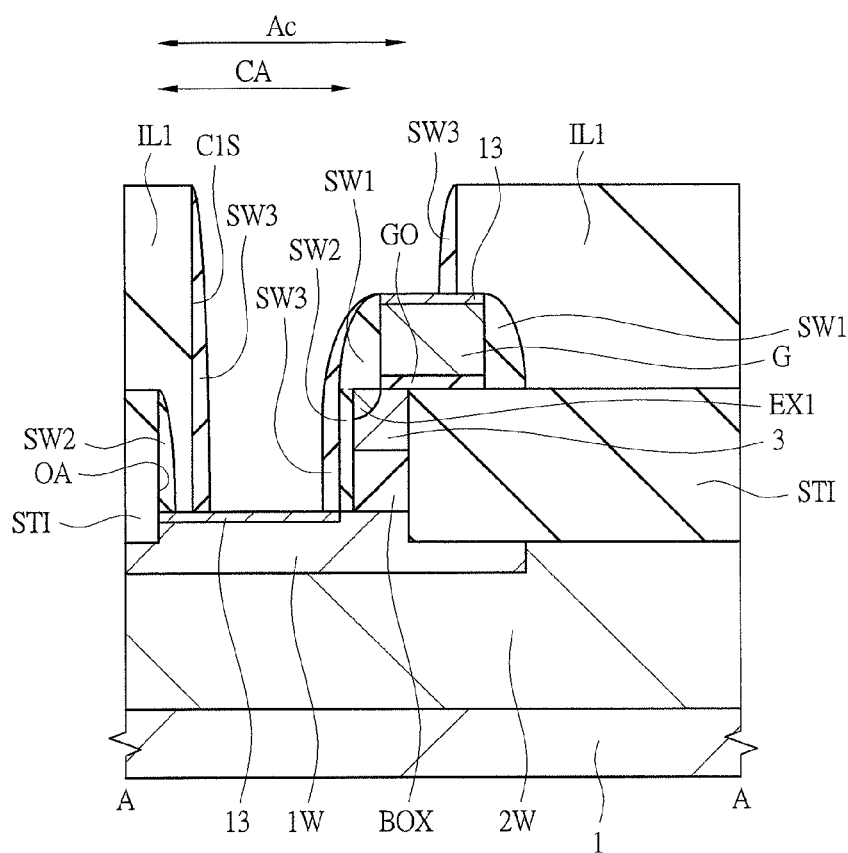
FIG. 47 is a cross-sectional view of a principal part illustrating a step of manufacturing a semiconductor device of a third embodiment as a modification example 1.
Figure 48:
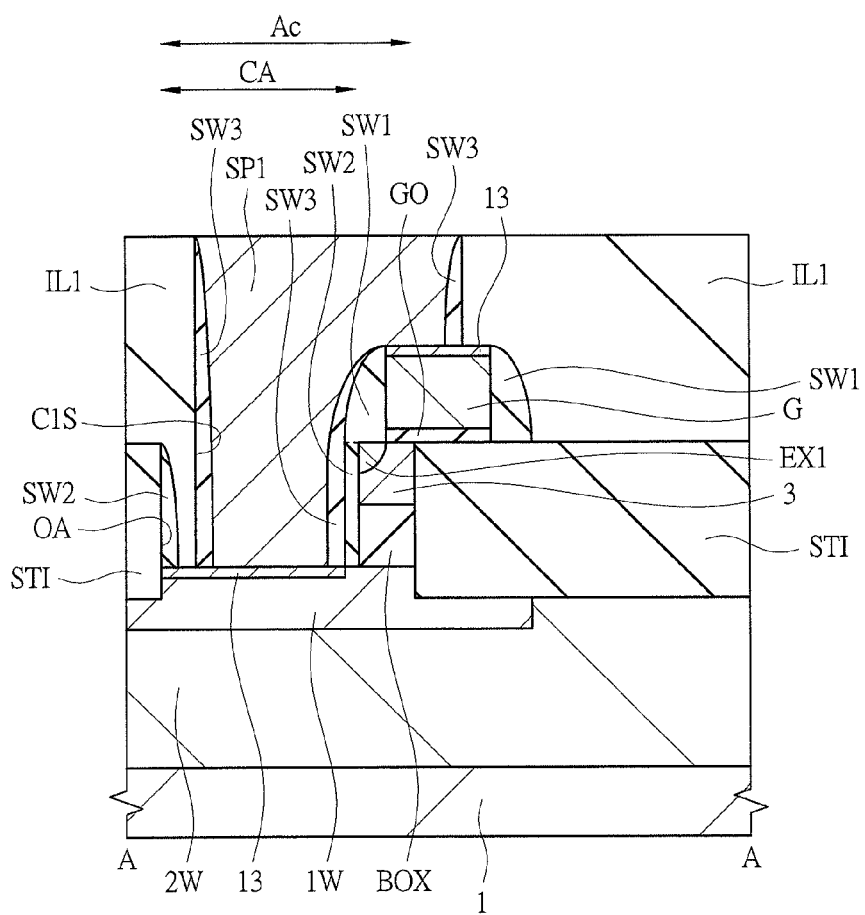
FIG. 48 is a cross-sectional view of a principal part illustrating the step of manufacturing the semiconductor device of the third embodiment as the modification example 1.

Each of FIGS. 47 and 48 is a cross-sectional view of a principal part illustrating a step of manufacturing a semiconductor device of the present embodiment as the modification example 1.

As similarly to the first embodiment, the n-channel-type MISFET (nT) including the source/drain regions having the LDD structure is formed on the SOI substrate. That is, the element isolation region STI is formed above the SOI substrate, and then, the semiconductor region 1W and the semiconductor region 2W whose conductivity type is opposite to that of the semiconductor region 1W are formed. Then, in the active region Ac, the insulating layer BOX, the semiconductor region 3, and others in the connection region CA are removed so as to form the opening portion OA. Then, the gate insulating film GO and the gate electrode G are formed on the main surface of the active region (Ac). Further, the n-type low-concentration impurity region EX1 is formed in the active region Ac on both sides of the gate electrode G, and then, the sidewall film SW1 is formed on the side walls on the both sides of the gate electrode G, and the n-type high-concentration impurity region SD is formed inside the active region Ac on both sides of the combined body of the gate electrode G and the sidewall film SW1. In this manner, the n-channel-type MISFET (nT) having the LDD structure including the n-type low-concentration impurity region EX1 and the n-type high-concentration impurity region SD is substantially completed (see FIGS. 7 to 31).

Then, as illustrated in FIG. 47, the metal silicide layer 13 is formed above the gate electrode G, the source/drain regions (SD), and others by a salicide technique, and then, the interlayer insulating film IL1 is formed. Then, the plurality of contact holes (connection holes) C1 and C1S are formed by etching the interlayer insulating film IL1. At this time, in the connection region CA, the metal silicide layer 13 on the p-type semiconductor region 1W is exposed from the bottom surface of the contact hole C1S.

Then, as an insulating film, for example, a silicon nitride film is deposited on the interlayer insulating film IL1 including the inside of the contact hole C1S by a CVD method, and is anisotropically etched, so that the insulating film can remain on the side walls of the contact hole C1S as the sidewall film SW3. In this manner, the side walls of the opening portion OA are covered with the sidewall film SW3. The term "covered" which is described here also includes a covering case that the side walls of the opening portion OA are covered with the sidewall film SW3 so as to interpose the sidewall film SW2. Although illustration is omitted, note that the sidewall film SW3 is formed also on the side walls of the contact hole C1.

Then, as illustrated in FIG. 48, the first plug (P1, the shared plug SP1) is formed inside the contact hole C1S. For example, as similarly to the first embodiment, the shared plug SP1 is formed by burying a conductive film inside the contact hole C1S. At this time, the conductive film is buried also inside the contact hole C1 so as to form the first plug P1.

As described above, in the present modification example 1, the sidewall film SW3 is arranged on the side walls of the contact hole C1S, and therefore, the insulating property between the shared plug SP1 and the semiconductor region 3 can be enhanced.

For example, when the sidewall film SW1 is formed on the both side walls of the gate electrode G, the sidewall film SW2 is also formed on the side walls of the opening portion OA so as to protect the side walls (exposed surfaces) of the semiconductor region 3. However, the thicknesses of the insulating layer BOX and the semiconductor region 3 are small, and therefore, it is considered that the thickness of the sidewall film SW2 on the side walls of the opening portion OA is small or all or a part thereof is removed depending on a condition of the anisotropic etching used when the sidewall films SW1 and SW2 are formed, which results in insufficient dielectric breakdown property thereof. Further, it is also considered that all or a part of the sidewall film SW2 is removed due to misalignment of the mask caused when the contact hole C1S is formed, which results in insufficient dielectric breakdown property thereof.

On the other hand, in the present modification example 1, the sidewall film SW3 is arranged on the side walls of the contact hole C1S, and therefore, the insulation property between the shared plug SP1 and the semiconductor region 3 can be enhanced in addition to the effects (for example, the above-described Effect 1, Effect 2, and others) of the first embodiment.

(Modification Example 2)

Figure 49:
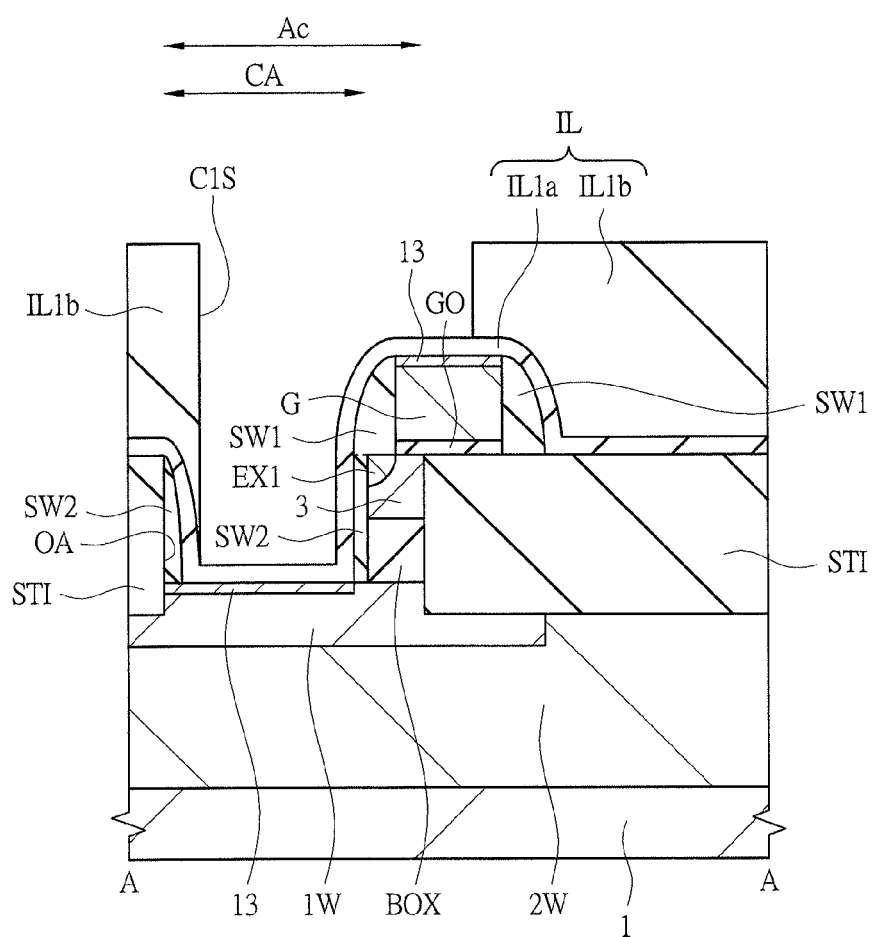
FIG. 49 is a cross-sectional view of a principal part illustrating a step of manufacturing a semiconductor device of the third embodiment as a modification example 2.
Figure 50:
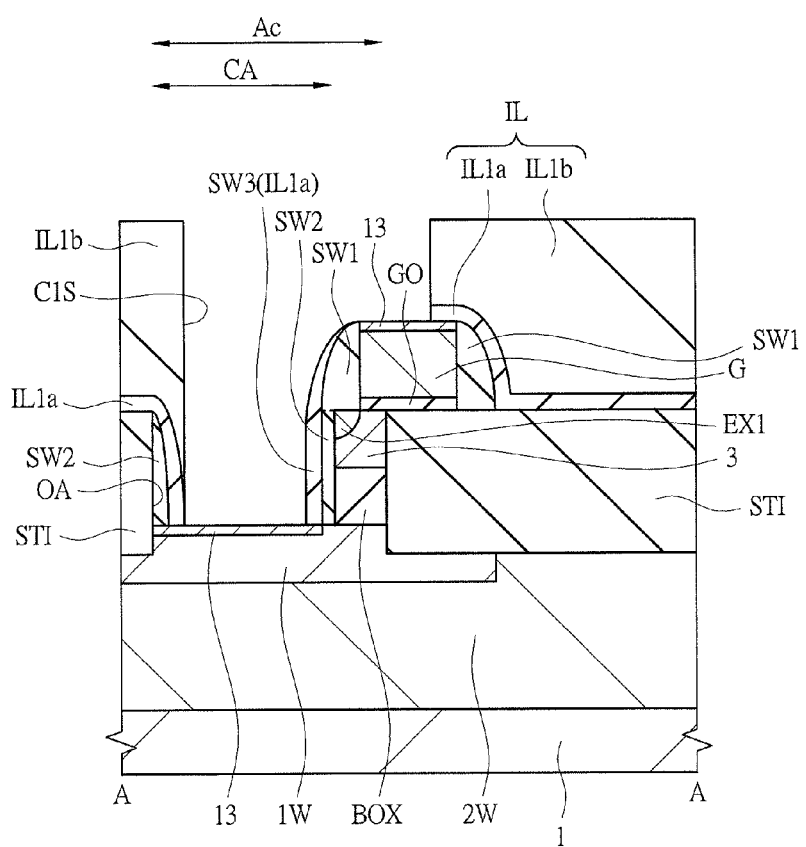
FIG. 50 is a cross-sectional view of a principal part illustrating the step of manufacturing the semiconductor device of the third embodiment as the modification example 2.
Figure 51:
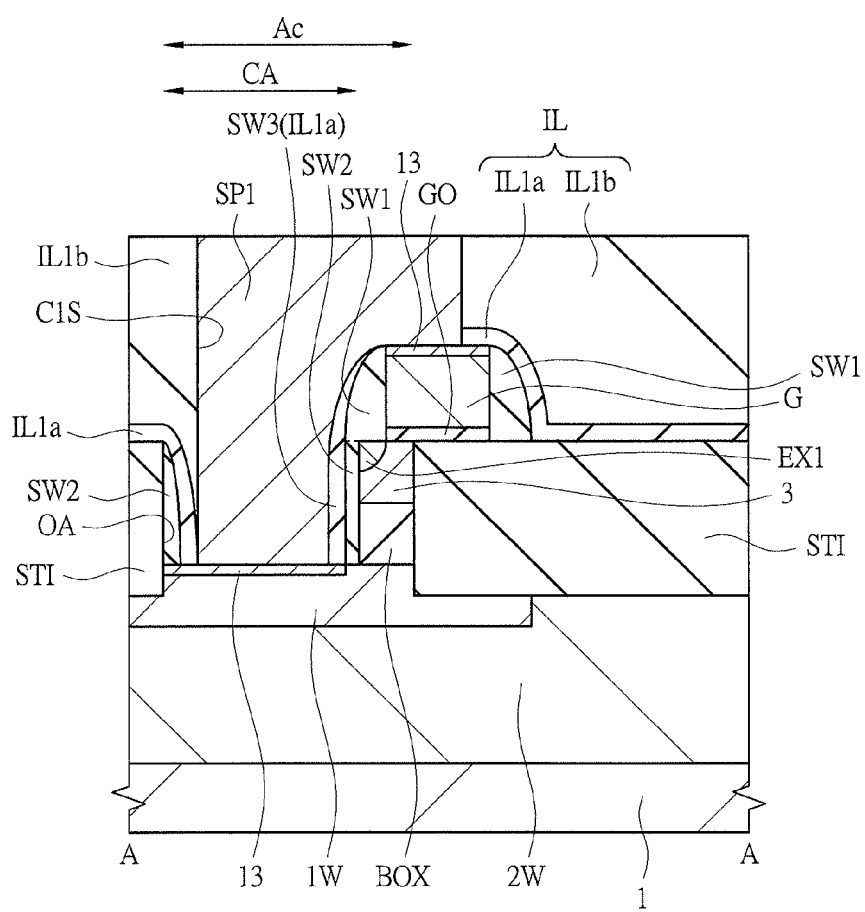
FIG. 51 is a cross-sectional view of a principal part illustrating the step of manufacturing the semiconductor device of the third embodiment as the modification example 2.

Each of FIGS. 49 to 51 is a cross-sectional view of a principal part illustrating a step of manufacturing a semiconductor device of the present embodiment as the modification example 2.

As similarly to the first embodiment, the n-channel-type MISFET (nT) including the source/drain regions having the LDD structure is formed on the SOI substrate. That is, the element isolation region STI is formed above the SOI substrate, and then, the semiconductor region 1W and the semiconductor region 2W whose conductivity type is opposite to that of the semiconductor region 1W are formed. Then, in the active region Ac, the insulating layer BOX, the semiconductor region 3, and others in the connection region CA are removed so as to form the opening portion OA. Then, the gate insulating film GO and the gate electrode G are formed on the main surface of the active region (Ac). Further, the n-type low-concentration impurity region EX1 is formed in the active region Ac on both sides of the gate electrode G, and then, the sidewall film SW1 is formed on the side walls on the both sides of the gate electrode G, and the n-type high-concentration impurity region SD is formed inside the active region Ac on both sides of the combined body of the gate electrode G and the sidewall film SW1. In this manner, the n-channel-type MISFET (nT) having the LDD structure including the n-type low-concentration impurity region EX1 and the n-type high-concentration impurity region SD is substantially completed (see FIGS. 7 to 31).

Then, as illustrated in FIG. 49, the metal silicide layer 13 is formed above the gate electrode G, the source/drain regions (SD), and others by a salicide technique, and then, the interlayer insulating film IL1 is formed. As this IL1, for example, a stacked film formed of a silicon nitride film "IL1a" and a silicon oxide film "IL1b" is used. This silicon nitride film IL1a plays a role of an etching stopper when the silicon oxide film IL1b is etched, and is formed thinner than the silicon oxide film IL1b.

Then, the silicon oxide film IL1b in the upper layer of the interlayer insulating film IL1 is etched until the silicon nitride film IL1a is exposed. At this time, inside the contact hole C1S, the silicon nitride film IL1a is exposed so as to cover the side walls of the opening portion OA from above the gate electrode G and extend to the bottom portion of the contact hole C1S.

Then, as illustrated in FIG. 50, the exposed silicon nitride film IL1a is anisotropically etched, so that the sidewall film SW3 is formed, and the metal silicide layer 13 on the bottom portion of the contact hole C1S is exposed. That is, the silicon nitride film IL1a remains so as to cover the sidewall film SW2 on the side wall of the opening portion OA from above the gate electrode G so as to be the sidewall film SW3, and besides, the contact hole C1S is opened. In this manner, the sidewall film SW3 may be formed by utilizing the etching stopper (in this case, the silicon nitride film IL1a) which configures the interlayer insulating film IL1. In this case, the sidewall film SW3 can be formed upon the opening step of the contact hole C1S, and therefore, the sidewall film SW3 can be formed during a short step.

Then, as illustrated in FIG. 51, the first plug (P1, the shared plug SP1) is formed inside the contact hole C1S. For example, as similarly to the first embodiment, the shared plug SP1 is formed by burying a conductive film inside the contact hole C1S. At this time, the conductive film is buried also inside the contact hole C1 so as to form the first plug P1.

As described above, in the present modification example 2, the sidewall film SW3 is arranged on the side walls of the contact hole C1S, and therefore, the insulating property between the shared plug SP1 and the semiconductor region 3 can be enhanced.

For example, when the sidewall film SW1 is formed on the both side walls of the gate electrode G, the sidewall film SW2 is also formed on the side walls of the opening portion OA so as to protect the side walls (exposed surfaces) of the semiconductor region 3.

However, the thicknesses of the insulating layer BOX and the semiconductor region 3 are small, and therefore, it is considered that the thickness of the sidewall film SW2 on the side walls of the opening portion OA is small or all or a part thereof is removed depending on a condition of the anisotropic etching used when the sidewall films SW1 and SW2 are formed, which results in insufficient dielectric breakdown property thereof. Further, it is also considered that all or a part of the sidewall film SW2 is removed due to misalignment of the mask caused when the contact hole C1S is formed, which results in insufficient dielectric breakdown property thereof.

On the other hand, in the present modification example 2, the sidewall film SW3 is arranged on the side walls of the opening portion OA as similarly to the above-described modification example 1, and therefore, the insulation property between the shared plug SP1 and the semiconductor region 3 can be enhanced in addition to the effects (for example, the above-described Effect 1, Effect 2, and others) of the first embodiment. Further, as the sidewall film SW3, the etching stopper which configures the interlayer insulating film IL1 is utilized, so that the sidewall film SW3 can be formed upon the opening step of the contact hole C1S during a short step.

(Fourth Embodiment)

In the first embodiment, the pn separation is formed so that the conductivity type of the semiconductor region 1W is the p-type and the conductivity type of the semiconductor region 2W is the n-type. However, the separation configuration of the semiconductor region 1W for independently controlling the potential of the semiconductor region 1W is not limited to that of the first embodiment but possible to employ various modifications. Hereinafter, as other modes of the above-described separation configuration, two examples of a modification example "a" and a modification example "b" will be explained.

(Modification Example a)

In the first embodiment, it is set that the conductivity type of the semiconductor region 1W is the p-type and the conductivity type of the semiconductor region 2W is the n-type (see FIG. 1). However, these conductivity types may be opposite conductivity types. That is, in the present modification example a, the conductivity type of the semiconductor region 1W is the n-type, and the conductivity type of the semiconductor region 2W is the p-type.

Figure 52:
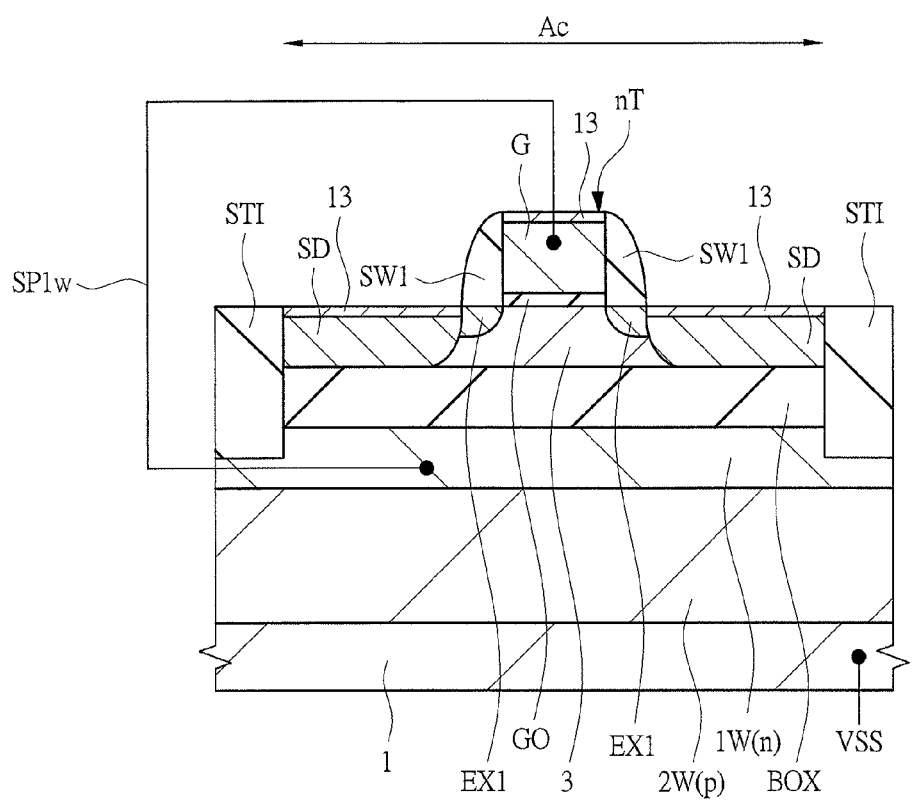

FIG. 52 is a cross-sectional view of a principal part of the n-channel-type MISFET which configures a semiconductor device of the present embodiment as the modification example a.

In this case, the n-type semiconductor region 1W is arranged below the active region Ac (semiconductor region 3) so as to interpose the insulating layer BOX. A bottom portion of this n-type semiconductor region 1W is positioned deeper than a bottom portion of the element isolation region STI. Further, the p-type semiconductor region 2W whose conductivity type is opposite to that of the n-type semiconductor region 1W is arranged below this n-type semiconductor region 1W. That is, the n-type semiconductor region 1W is surrounded by the p-type semiconductor region 2W so as to form a state of pn separation. More specifically, the insulating layer BOX is positioned above the n-type semiconductor region 1W, and the bottom portion and the side portions of the n-type semiconductor region 1W are arranged so as to be in contact with the p-type semiconductor region 2W.

As described above, the n-type semiconductor region 1W below the formation region (Ac) of the n-channel-type MISFET (nT) is electrically separated by the p-type semiconductor region 2W positioned at the bottom portion and the outer periphery thereof, and the gate electrode G and the above-described n-type semiconductor region 1W are electrically connected to each other, so that the operating characteristics of the MISFET can be improved (see Effect 1) as explained in detail in the first embodiment.

(Modification Example b)

In the above-described modification example a, the bottom portion of this n-type semiconductor region 1W is arranged deeper than the bottom portion of the element isolation region STI. However, the element isolation region STI may be formed deeper.

Figure 53:
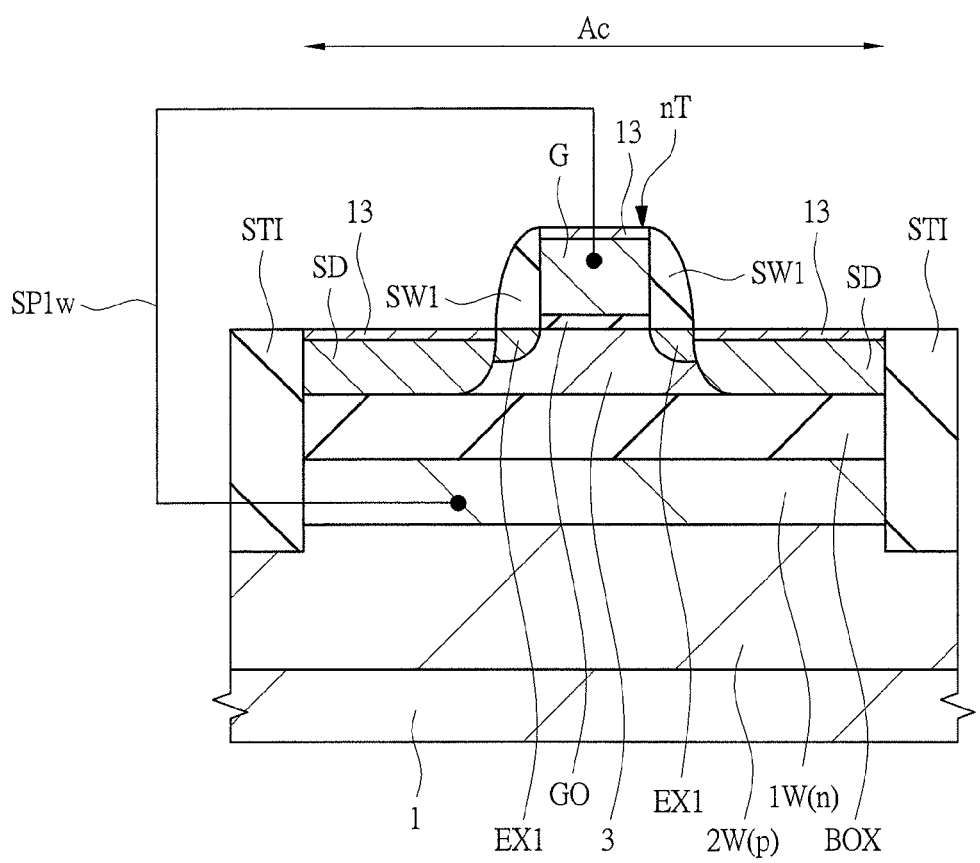
FIG. 53 is a cross-sectional view of a principal part of an n-channel-type MISFET which configures a semiconductor device of the fourth embodiment as a modification example b.

FIG. 53 is a cross-sectional view of a principal part of an n-channel-type MISFET which configures a semiconductor device of the present embodiment as the modification example b.

In this case, the n-type semiconductor region 1W is arranged below the active region Ac (semiconductor region 3) so as to interpose the insulating layer BOX. A bottom portion of this n-type semiconductor region 1W is positioned shallower than a bottom portion of the element isolation region STI. Further, the p-type semiconductor region 2W whose conductivity type is opposite to that of the n-type semiconductor region 1W is arranged below this n-type semiconductor region 1W. That is, the insulating layer BOX is positioned above the n-type semiconductor region 1W, the side portions of the n-type semiconductor region 1W are arranged so as to be in contact with the element isolation region STI, and the bottom portion of the n-type semiconductor region 1W is arranged so as to be in contact with the p-type semiconductor region 2W.

Also according to the present configuration, the n-type semiconductor region 1W below the formation region (Ac) of the n-channel-type MISFET (nT) can be electrically separated by the element isolation region STI and the p-type semiconductor region 2W, and the gate electrode G and the above-described n-type semiconductor region 1W are electrically connected to each other, so that the operating characteristics of the MISFET can be improved (see Effect 1) as explained in detail in the first embodiment.

For example, when the p-type semiconductor region 2W is arranged below the n-channel-type MISFET (NMOS) so as to interpose the insulating layer BOX as described in the above-described first embodiment, there is a merit described below.

For example, when a bulk element and the SOI element as described in the present application are formed on the same wafer (semiconductor substrate), the impurity implantation into the insulating layer BOX of the SOI element can be performed in the similar step as that for the bulk element, so that the manufacturing steps can be simplified.

On the other hand, when the n-type semiconductor region 1W is arranged below the n-channel-type MISFET (NMOS) so as to interpose the insulating layer BOX as the above-described modification example a, there is a merit described below.

For example, in a case of a structure in which an electric potential of a well below the insulating layer BOX is variable in both of SOI-NMOS and SOI-PMOS, it is required to separate the both wells from each other. Therefore, a triple-well structure is required. However, when the gate and the well are connected to each other to operate in a DT (Dynamic Transient) mode, if a structure of an n-type well is selected for the NMOS and a structure of a p-type well is selected for the PMOS, a twin-well structure is only required. This is because, in the case of the NMOS, the potential of the well is opposite in only a case between GND and Vcc, so that a leakage current can be suppressed even in the twin-well structure.

Moreover, when the bottom portion of the element isolation region STI is arranged deeper than the bottom portion of the semiconductor region 1W as described in the above-described modification example b, there is a merit described below.

The insulated separation by the STI is made between adjacent elements, and therefore, a width of the separation can be reduced. This is because increase in a depletion layer below the STI can be suppressed.

(Fifth Embodiment)

In the first embodiment, the n-channel-type MISFET has been explained as the example. However, in the present embodiment, a p-channel-type MISFET will be explained as an example.

Figures 54, 55:
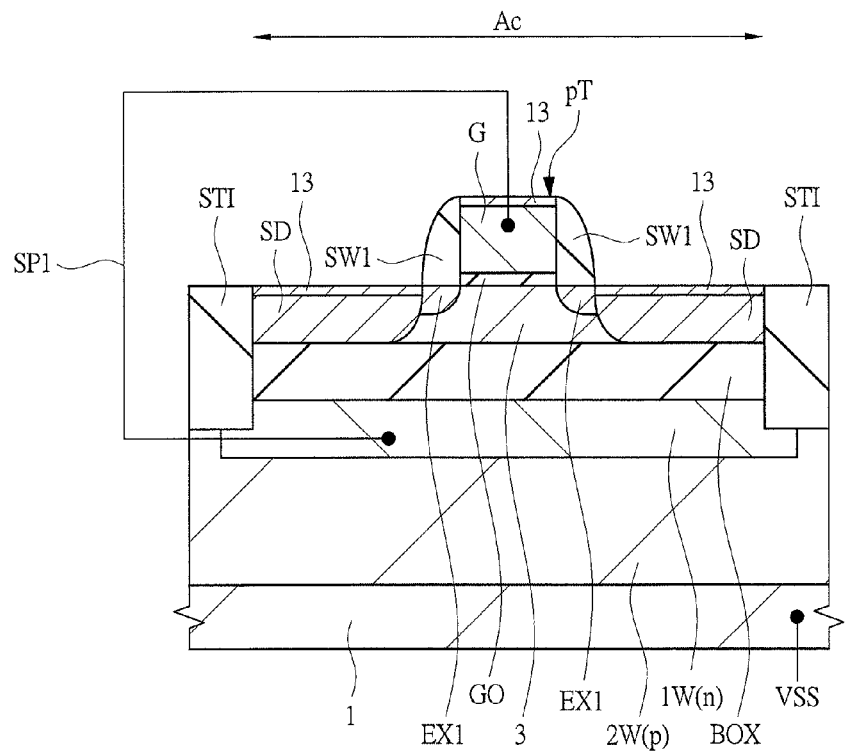
FIG. 54 is a schematic cross-sectional view of a p-channel-type MISFET which configures a semiconductor device of a fifth embodiment.
FIG. 55 is a table illustrating applied states of potentials of the p-channel-type MISFET.

FIG. 54 is a schematic cross-sectional view of a p-channel-type MISFET which configures a semiconductor device of the present embodiment. FIG. 55 is a table illustrating applied states of potentials of the p-channel-type MISFET.

As illustrated in FIG. 54, the p-channel-type MISFET (pT) is formed on a main surface of a semiconductor region 3 which configures an SOI substrate. The SOI substrate includes a supporting substrate 1, an insulating layer "BOX", and a semiconductor region (element formation region) 3 above it. The supporting substrate 1 is, for example, a p-type monocrystalline silicon substrate.

This p-channel-type MISFET (pT) includes: a gate electrode "G" arranged on the semiconductor region 3 so as to interpose a gate insulating film "GO"; and a source/drain region arranged on both sides of this gate electrode G. This source/drain region has an LDD structure including an n-type low-concentration impurity region "EX1" and an n-type high-concentration impurity region "SD". Note that "13" denotes a metal silicide layer.

An n-type semiconductor region (well region, back gate region) "1W" is arranged below the semiconductor region 3, on which the p-channel-type MISFET (pT) is arranged, so as to interpose the insulating layer BOX. A bottom portion of this n-type semiconductor region 1W is positioned deeper than a bottom portion of an element isolation region "STI". Further, a p-type semiconductor region (well region, back gate region) "2W" whose conductivity type is opposite to that of the n-type semiconductor region 1W is arranged below this n-type semiconductor region 1W. That is, the n-type semiconductor region 1W is surrounded by the p-type semiconductor region 2W so as to form a state of pn separation. More specifically, the insulating layer BOX is positioned above the n-type semiconductor region 1W, and the bottom portion and side portions of the n-type semiconductor region 1W are arranged so as to be in contact with the p-type semiconductor region 2W. Note that a part of the side portions of the n-type semiconductor region 1W may be in contact with the element isolation region STI.

Here, in the present embodiment, the gate electrode G of the p-channel-type MISFET (pT) and the n-type semiconductor region 1W below it are electrically connected to each other. This electrical connection is achieved by a shared plug "SP1" as explained in detail later. Also, the p-type semiconductor region 2W is connected to a ground potential (VSS, reference potential, second potential, which is lower than the first potential) via a supporting substrate 1.

In this manner, the n-type semiconductor region 1W below a formation region (Ac) of the p-channel-type MISFET (pT) is electrically separated by the p-type semiconductor region 2W positioned at the bottom portion and outer periphery thereof, so that the potential of the n-type semiconductor region 1W can be individually controlled. Also, a threshold potential (Vth) can be dynamically controlled [Effect 1] by electrically connecting the gate electrode G of the p-channel-type MISFET (pT) and the above-described n-type semiconductor region 1W to each other. That is, when the MISFET is in an on state (on), the n-type semiconductor region 1W and the gate electrode are at the same potential, so that the threshold potential (Vth) can be decreased, and an on-state current can be increased. Conversely, when the MISFET is in an off state (off), the threshold potential (Vth) can be increased, and an off-state current can be decreased. In this manner, operating characteristics of the MISFET can be improved. Also, by such improvement in the characteristics, a difference between voltages (power-supply voltage, power-supply potential, driving voltage, driving potential) applied to the gate electrode and the threshold potential is substantially increased, so that low-potential driving can be achieved.

Further, by achieving the electrical connection between the gate electrode G of the p-channel-type MISFET (pT) and the n-type semiconductor region 1W by the shared plug SP1, the formation region of the p-channel-type MISFET (pT) can be downsized [Effect 2]. Note that the configuration of the shared plug SP1 of the p-channel-type MISFET (pT) of the present embodiment and the step of manufacturing the same are similar to those of the first embodiment explained with reference to FIGS. 3 to 40 and others, and therefore, explanation thereof will be omitted. That is, they are similar thereto except that the conductivity type of the semiconductor region 1W is the n-type, that the conductivity type of the semiconductor region 2W is the p-type, and that the MISFET is the p-channel type.

Also, as explained in the fourth embodiment, the separation configuration of the semiconductor region 1W is possible to employ various modifications.

Figure 56:
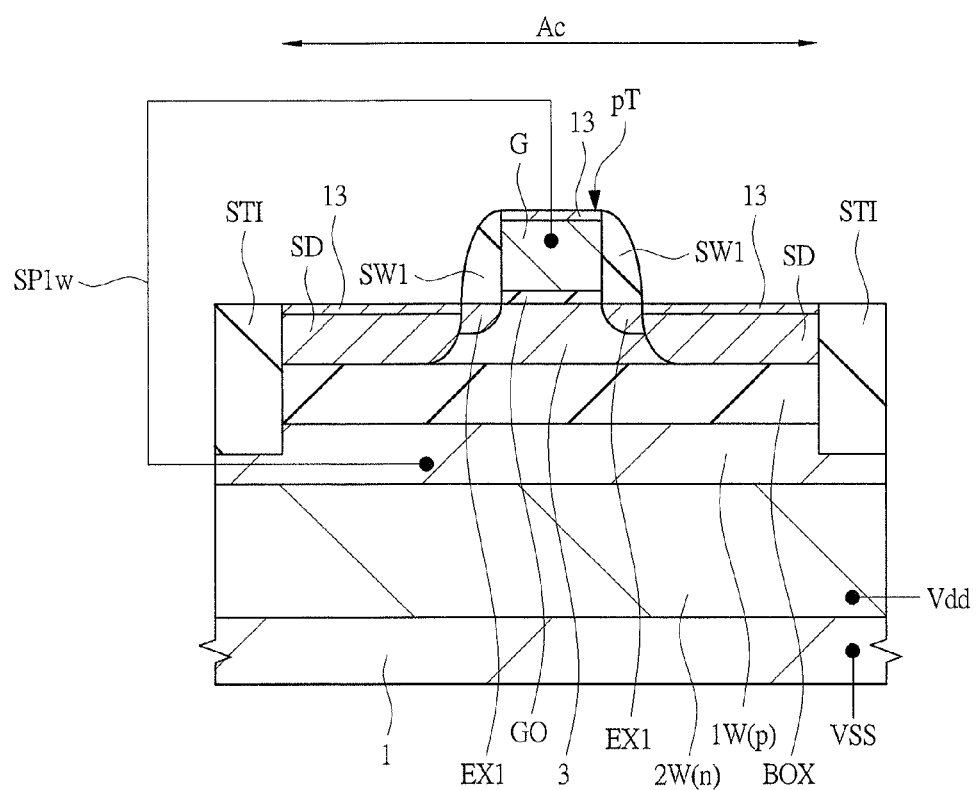
FIG. 56 is a cross-sectional view of a principal part of a p-channel-type MISFET which configures a semiconductor device of the fifth embodiment as a first modification example.

FIG. 56 is a cross-sectional view of a principal part of the p-channel-type MISFET which configures the semiconductor device of the present embodiment as the first modification example.

In this case, a p-type semiconductor region "1W" is arranged below the active region "Ac" (semiconductor region 3) so as to interpose the insulating layer BOX. A bottom portion of this p-type semiconductor region 1W is positioned deeper than a bottom portion of an element isolation region "STI". Further, an n-type semiconductor region "2W" whose conductivity type is opposite to that of the p-type semiconductor region 1W is arranged below this p-type semiconductor region 1W. That is, the p-type semiconductor region 1W is surrounded by the n-type semiconductor region 2W so as to form a state of pn separation. More specifically, the insulating layer BOX is positioned above the p-type semiconductor region 1W, and the bottom portion and side portions of the p-type semiconductor region 1W are arranged so as to be in contact with the n-type semiconductor region 2W.

In this manner, the p-type semiconductor region 1W below a formation region (Ac) of the p-channel-type MISFET (pT) is electrically separated by the n-type semiconductor region 2W positioned at the bottom portion and outer periphery thereof, and the gate electrode G and the above-described p-type semiconductor region 1W are electrically connected to each other, so that the operating characteristics of the MISFET can be improved [see the Effect 1] as similarly to the case illustrated in FIG. 54.

Figure 57:
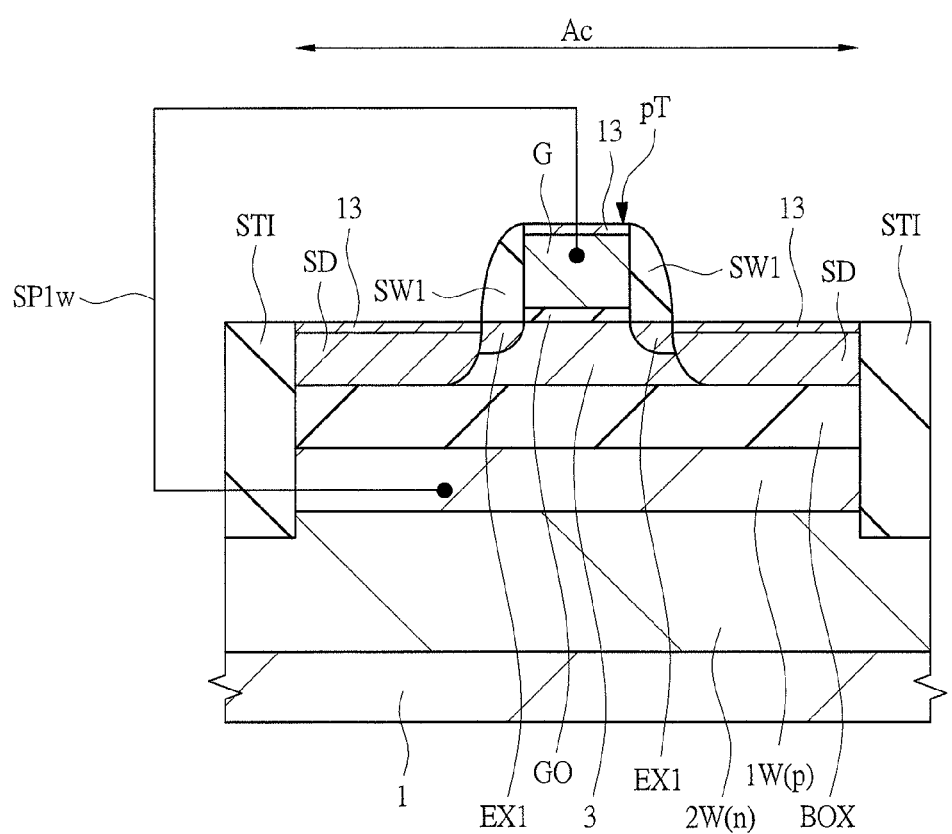
FIG. 57 is a cross-sectional view of a principal part of a p-channel-type MISFET which configures a semiconductor device of the fifth embodiment as a second modification example.

FIG. 57 is a cross-sectional view of a principal part of the p-channel-type MISFET which configures the semiconductor device of the present embodiment as the second modification example.

In this case, a p-type semiconductor region "1W" is arranged below the active region "Ac" (semiconductor region 3) so as to interpose the insulating layer BOX. A bottom portion of this p-type semiconductor region 1W is positioned shallower than a bottom portion of an element isolation region "STI". Further, an n-type semiconductor region "2W" whose conductivity type is opposite to that of the p-type semiconductor region 1W is arranged below this p-type semiconductor region 1W. That is, the insulating layer BOX is positioned above the p-type semiconductor region 1W, the side portions of the p-type semiconductor region 1W are arranged so as to be in contact with the element isolation region STI, and the bottom portion of the p-type semiconductor region 1W is arranged so as to be in contact with the n-type semiconductor region 2W.

Also according to the present configuration, the p-type semiconductor region 1W below the formation region (Ac) of the p-channel-type MISFET (pT) can be electrically separated by the element isolation region STI and the n-type semiconductor region 2W, and the gate electrode G and the above-described p-type semiconductor region 1W are electrically connected to each other, so that the operating characteristics of the MISFET can be improved [see the Effect 1] as similarly to the case illustrated in FIG. 54.

(Sixth Embodiment)

The semiconductor devices (the n-channel-type MISFET and the p-channel-type MISFET) explained in the above-described first to fifth embodiments are not limited for their applied portions, and the MISFETs can be applied to, for example, a memory cell of an SRAM (Static Random Access Memory).

[Circuit Configuration]

Figure 58:
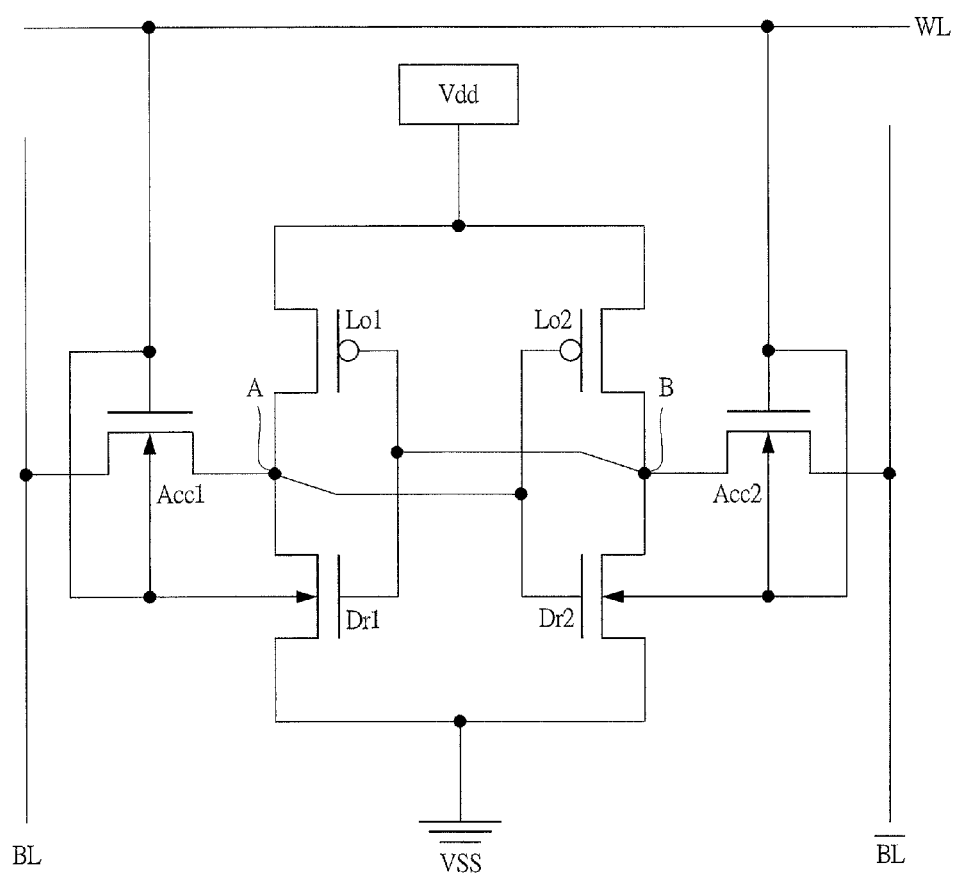
FIG. 58 is an equivalent circuit diagram illustrating a memory cell of an SRAM of a sixth embodiment.

FIG. 58 is an equivalent circuit diagram illustrating a memory cell of an SRAM of the present embodiment. As illustrated in the drawing, the memory cell is arranged at an intersect portion between a pair of bit lines (bit line "BL" and bit line "$\overline{BL}$") and a word line "WL". This memory cell includes: a pair of load transistors (load MOSes, transistors for load, load MISFETs) Lo1 and Lo2; a pair of access transistors (access MOSes, transistors for access, access MISFETs, transfer transistors) Acc1 and Acc2; and a pair of driver transistors (driver MOSes, driver transistors, driver MISFET) Dr1 and Dr2.

The load transistors (Lo1 and Lo2) of the above-described six transistors configuring the above-described memory cell are p-channel-type MISFETs, and the access transistors (Acc1 and Acc2) and the driver transistors (Dr1 and Dr2) thereof are n-channel-type MISFETs.

Note that each of the above-described load transistors, access transistors, and driver transistors are sometimes simply referred to as "transistor" below. Also, each transistor is sometimes referred to as only the symbol of each transistor (Lo1, Lo2, Acc1, Acc2, Dr1, and Dr2).

The Lo1 and the Acc1 of the above-described six transistors configuring the memory cell configure a CMOS inverter, and the Lo2 and the Acc2 thereof configure another CMOS inverter. Mutual input/output terminals (storage nodes "A" and "B") of a pair of these CMOS inverters are cross-coupled so as to configure a flip-flop circuit serving as an information storage unit that stores 1-bit information.

A connection relation among the above-described six transistors configuring the SRAM memory cell will be described in detail as follows.

The Lo1 is connected between a power-supply potential (first potential) "Vdd" and the storage node A, the Dr1 is connected between the storage node A and a ground potential (GND, 0 V, reference potential, a second potential which is lower than the first potential), and the gate electrodes of the Lo1 and the Dr1 are connected to the storage node B.

The Lo2 is connected between the power-supply potential Vdd and the storage node B, the Dr2 is connected between the storage node B and the ground potential VSS, and the gate electrodes of the Lo2 and the Dr2 are connected to the storage node A.

The Acc1 is connected between the bit line BL and the storage node A, the Acc2 is connected between the bit line $\overline{BL}$ and the storage node B, and the gate electrodes of the Acc1 and the Acc2 are connected to the word line WL (to be a word line).

Here, the above-described six transistors are formed in the semiconductor region 3 which is an SOI layer of the SOI substrate.

Further, the gate electrode of the access transistor (Acc1) of the present embodiment is connected to a back gate of the access transistor (Acc1) (FIG. 58). The "back gate" in the present embodiment is the p-type semiconductor region 1W arranged below the above described, semiconductor region 3 so as to interpose the insulating layer BOX (see FIG. 1 and others). Also, the gate electrode of the access transistor (Acc2) is connected to a back gate of the access transistor (Acc2) (FIG. 58). The "back gate" in the present embodiment is the p-type semiconductor region 1W arranged below the above-described semiconductor region 3 so as to interpose the insulating layer BOX (see FIG. 1 and others).

[Memory Operation]

A memory operation of the memory cell of the above-described SRAM will be explained. When the storage node A of the CMOS inverter is at a high potential (H), the Dr2 is in an on-state, and therefore, the storage node B of another CMOS inverter becomes at a low potential (L). Therefore, the Lo1 is in an on-state, the Dr1 is in an off-state, so that the high potential (H) of the storage node A is maintained. That is, the mutual states of the storage nodes A and B are maintained by a latch circuit in which the pair of CMOS inverters are cross-coupled, and information is maintained during the application of the power supply.

Meanwhile, the word line WL is connected to each gate electrode of the Acc1 and the Acc2. That is, when the word line WL is at a high potential (H), the Acc1 and the Acc2 become in an on-state, so that the flip-flop circuit and the bit lines (BL and $\overline{BL}$) are electrically connected, and therefore, a potential state (a combination of the H and the L or a combination of the L and the H) between the storage nodes A and B occurs on the bit lines BL and $\overline{BL}$, and is read as the information of the memory cell.

Also, when information is written to the memory cell, the word line WL is brought to a high potential (H), and the Acc1 and the Acc2 become in the on-state, so that the flip-flop circuit and the bit lines (BL and $\overline{BL}$) are electrically connected to each other, and the information of the bit lines BL and $\overline{BL}$ (the combination of the H and the L or the combination of the L and the H) is transmitted to the storage nodes A and B, and the information is stored as described above.

[Transistor Configuration]

Here, the configuration of the n-channel-type MISFET (see FIG. 1 and others) explained in the first embodiment is applied as the access transistor (Acc1) which configures the memory cell of the SRAM of the present embodiment. That is, the gate electrode and the p-type semiconductor region 1W are electrically separated by the semiconductor region 2W, so that the potential of the p-type semiconductor region 1W is individually controlled. Also, the electrical connection between the gate electrode G of the n-channel-type MISFET (nT) and the p-type semiconductor region 1W is established by the shared plug SP1.

Figure 59:
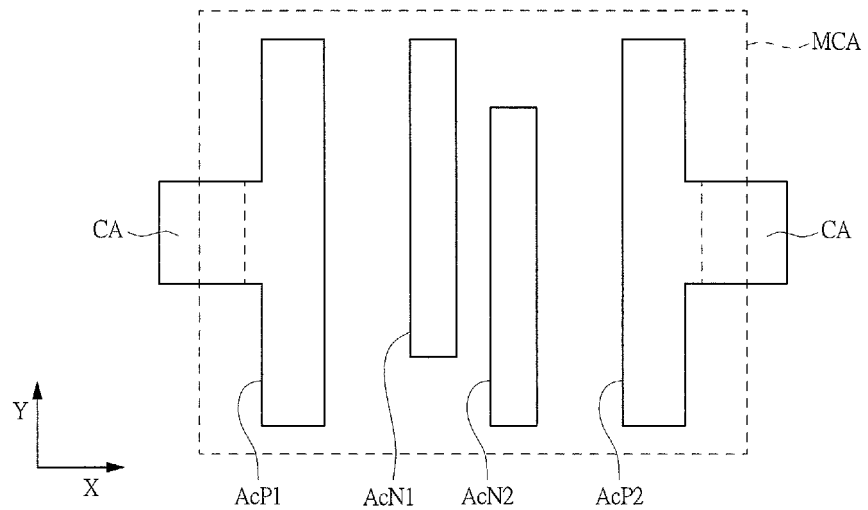
FIG. 59 is a plan view illustrating a structure of a memory cell region of the SRAM of the sixth embodiment.
Figure 60:
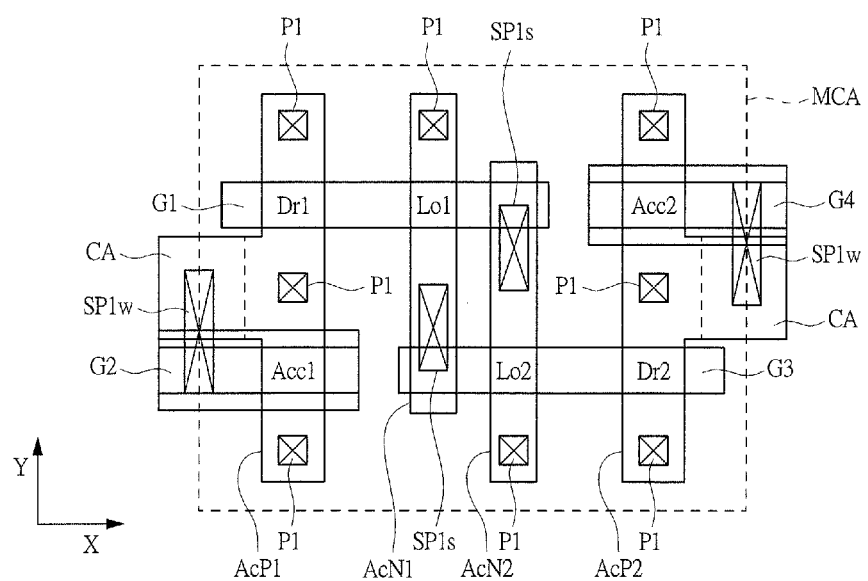
FIG. 60 is a plan view illustrating the structure of the memory cell region of the SRAM of the sixth embodiment.

Each of FIGS. 59 and 60 is a plan view illustrating a configuration of a memory cell region of the SRAM of the present embodiment. A substantially-rectangular region surrounded by a broken line illustrated in FIGS. 59 and 60 represents a 1 (1-bit) memory cell region "MCA". As illustrated in the drawings, four active regions (AcP1, AcN1, AcN2, and AcP2) are sequentially arranged in a direction "X". In this case, a symbol is added to each symbol "Ac" representing the active region so as to represent an individual region. A portion between these active regions (Ac) is the element isolation region (STI) as described above. In other words, the active regions (Ac) are partitioned by the element isolation region (STI).

Also, as described above, semiconductor regions ("1W" and "2W") are arranged below the active region "Ac" so as to interpose the insulating layer BOX. The p-type semiconductor region 1W of these semiconductor regions (1W and 2W) is arranged below each of two active regions ("AcP1" and "AcP2"), the n-type semiconductor region 2W thereof is arranged below the active regions ("AcN1" and "AcN2") so as to extend below the p-type semiconductor region 1W below the two active regions (AcP1 and AcP2). In this manner, the p-type semiconductor region 1W is separated by the n-type semiconductor region 2W so as to form a state of pn separation.

Here, as illustrated in FIG. 59, a connection region CA is provided in the active region AcP1. More specifically, the active region AcP1 includes: a rectangular region with a long side in a "Y" direction; and a protruding region (wide portion) which protrudes in an "X" direction from a center of the region (see FIG. 59). The connection region CA is provided in the protruding region (wide portion). As explained in the first embodiment or others, in this connection region CA, the semiconductor region 3 and the insulating layer BOX are removed, and the opening portion OA is arranged. Below this active region AcP1, the p-type semiconductor region 1W is arranged so as to interpose the insulating layer BOX. Further, below this p-type semiconductor region 1W, the n-type semiconductor region 2W is arranged.

The active region AcN1 has a quadrangular shape with a long side in the Y direction. Below this active region AcN1, for example, the n-type semiconductor region 2W is arranged so as to interpose the insulating layer BOX. Note that this n-type semiconductor region 2W extends to a bottom portion of the p-type semiconductor region 1W.

The active region AcN2 has a quadrangular shape with a long side in the Y direction. Below this active region AcN2, for example, the n-type semiconductor region 2W is arranged so as to interpose the insulating layer BOX. Note that this n-type semiconductor region 2W extends to a bottom portion of the p-type semiconductor region 1W.

A connection region CA is provided in the active region AcP2. More specifically, the active region AcP2 includes: a rectangular region with a long side in the Y direction; and a protruding region (wide portion) which protrudes in the X direction from a center of the region (see FIG. 59). The connection region CA is provided in the protruding region (wide portion). As explained in the first embodiment and others, in this connection region CA, the semiconductor region 3 and the insulating layer BOX are removed, and the opening portion OA is arranged. Below this active region AcP2, the p-type semiconductor region 1W is arranged so as to interpose the insulating layer BOX. Further, below this p-type semiconductor region 1W, the n-type semiconductor region 2W is arranged.

As illustrated in FIG. 60, on the above-described four active regions (AcP1, AcN1, AcN2, and AcP2), gate electrodes (gate wiring, linear gate) G ("G1" to "G4") extend to cross each of the active regions in the X direction so as to interpose the gate insulating film (GO) so as to form the six transistors explained in the above-described section of "Circuit Configuration". Note that the active regions (Ac) on both sides of the gate electrode G serve as the source/drain regions of the transistor.

More specifically, a common gate electrode G1 is arranged so as to cross over the active regions AcP1 and AcN1. In this manner, the Dr1 is arranged on the active region AcP1, the Lo1 is arranged on the active region AcN1, so that these gate electrodes (G) are connected to each other. This common gate electrode G1 extends to above the active region AcN2, and is connected to the source/drain regions of the Lo2 by a shared plug "SP1s".

On the active region AcP1, the gate electrode G2 is arranged so as to be parallel to the above-described common gate electrode G1. In this manner, the Acc1 is arranged on the active region AcP1, so that the source/drain regions of the Dr1 and the source/drain regions of the Acc1 are connected to each other (so as to be common). Above this gate electrode G2, a shared plug "SP1w" is arranged. This shared plug SP1w is provided so as to extend from above the gate electrode G2 to the connection region CA (opening portion OA), and corresponds to the shared plug SP1 explained in the first embodiment and others. Therefore, this shared plug SP1w is connected to the p-type semiconductor region 1W so as to interpose the metal silicide layer 13 (see FIG. 3 and others). As described above, by connecting the gate electrode G2 of the Acc1 and the p-type semiconductor region 1W below it to each other by the shared plug SP1w which is a single conductive member (integrally-formed conductive film, continuous conductive film), the effects (the Effect 1, the Effect 2, and others) explained in the first embodiment can be achieved.

Further, a common gate electrode G3 is arranged so as to cross over the active regions AcP2 and AcN2. In this manner, the Dr2 is arranged on the active region AcP2, the Lo2 is arranged on the active region AcN2, so that these gate electrodes (G) are connected to each other. This common gate electrode G3 extends to above the active region AcN1, and is connected to the source/drain regions of the Lo1 by a shared plug "SP1s".

On the active region AcP2, the gate electrode G4 is arranged so as to be parallel to the above-described common gate electrode G3. In this manner, the Acc2 is arranged on the active region AcP2, so that the source/drain regions of the Dr2 and the source/drain regions of the Acc2 are connected to each other (so as to be common). Above this gate electrode G4, a shared plug "SP1w" is arranged. This shared plug SP1w is provided so as to extend from above the gate electrode G4 to the connection region CA (opening portion OA), and corresponds to the shared plug SP1 explained in the first embodiment and others. Therefore, this shared plug SP1w is connected to the p-type semiconductor region 1W so as to interpose the metal silicide layer 13 (see FIG. 3 and others). As described above, by connecting the gate electrode G4 of the Acc2 and the p-type semiconductor region 1W below it to each other by the shared plug SP1w which is a single conductive member (integrally-formed conductive film, continuous conductive film), the effects (the Effect 1, the Effect 2, and others) explained in the first embodiment can be achieved.

Also, in the above-described four gate electrodes G1 to G4, two of them are arranged on the same line (linearly). More specifically, the common gate electrode G1 crossing over the active regions AcP1 and AcN1 and the gate electrode G4 on the active region AcP2 are arranged on the same line extending in the X direction. The common gate electrode G3 crossing over the active regions AcP2 and AcN2 and the gate electrode G2 on the active region AcP1 are arranged on the same line extending in the X direction.

The first plugs P1 (including SP1s and SP1w) are arranged on the source/drain regions of the above-described six transistors (Dr1, Acc1, Lo1, Lo2, Acc2, and Dr2). The first plugs P1 are plugs connected to a first-layer wiring. Also, the first plugs P1 are arranged also on the four gate electrodes G1 to G4. By connecting these first plugs to the first-layer wiring and a wiring in an upper layer, the circuit illustrated in FIG. 58 can be formed.

As described above, by applying the configuration of the n-channel-type MISFET unit explained in the first embodiment and others to the access transistor (Acc1, Acc2) unit of the SRAM, the effects (the Effect 1, the Effect 2, and others) explained in the first embodiment can be achieved. More particularly, in the SRAM, a plurality of transistors are formed in a small region, and therefore, it is preferred to apply the configuration of the n-channel-type MISFET unit explained in the first embodiment and others. Note that the application to the access transistor (Acc1, Acc2) unit has been explained as the example here. However, it may be applied to other transistor (load transistor or driver transistor) unit.

In the foregoing, the invention made by the present inventors has been concretely described based on the embodiments. However, it is needless to say that the present invention is not limited to the foregoing embodiments and various modifications and alterations can be made within the scope of the present invention.

For example, appropriate combinations of the configurations of the above-described embodiments can be applied. For example, the configuration of the third embodiment may be applied to the configuration of the second embodiment.

The present invention can be widely applied to a semiconductor device and industries using the semiconductor device.

What is claimed is:

1. A semiconductor device comprising:
   (a) a MISFET arranged in an active region formed of a semiconductor region surrounded by an element isolation region;
   (b) an insulating layer arranged below the active region;
   (c) a first semiconductor region having a first conductivity type, arranged below the active region so as to interpose the insulating layer; and
   (d) a second semiconductor region having a second conductivity type opposite to the first conductivity type, arranged below the first semiconductor region,
   the first semiconductor region including a connection region extending from below the insulating layer, and
   the first semiconductor region and a gate electrode of the MISFET being connected to each other by an integrally-formed first conductive film extending from above the gate electrode to above the connection region.

2. The semiconductor device according to claim 1, wherein the connection region is provided inside the active region, and is an opening portion in which the semiconductor region and the insulating layer are removed, and a shape of the active region includes a wide portion in which the connection region is arranged.

3. The semiconductor device according to claim 2, wherein the shape of the active region is a trapezoidal shape which is a combined shape of rectangle and triangle, and the connection region is provided in a portion corresponding to the triangle.

4. The semiconductor device according to claim 3, wherein the gate electrode extends along an upper base of the trapezoidal shape in a first direction, and the first conductive film extends from above the gate electrode to above the connection region in a second direction crossing the first direction.

5. The semiconductor device according to claim 2, wherein the shape of the active region is a polygonal shape which is a combined shape of first rectangle and second rectangle being adjacent to the first rectangle and having a smaller area than that of the first rectangle, and the connection region is provided in a portion corresponding to the second rectangle.

6. The semiconductor device according to claim 5, wherein the gate electrode extends along a short side of the first rectangle in a first direction, and the first conductive film extends from above the gate electrode to above the connection region in a second direction crossing the first direction.

7. The semiconductor device according to claim 1, wherein the connection region is provided so as to be separated from the active region, and the element isolation region is arranged between the connection region and the active region, and
the connection region is an opening portion in which the semiconductor region and the insulating layer are removed.

8. The semiconductor device according to claim 2, wherein the semiconductor device includes a second conductive film arranged on source/drain regions of the MISFET, and
a first connection hole in which the first conductive film is arranged is formed in the same step as that of a second connection hole in which the second conductive film is arranged.

9. The semiconductor device according to claim 2, wherein the semiconductor device includes a first sidewall insulating film on side walls of the gate electrode, and
the semiconductor device includes a second sidewall insulating film on side walls of the opening portion.

10. The semiconductor device according to claim 9, wherein
the second sidewall insulating film is formed in the same step as that of the first sidewall insulating film on the side walls of the gate electrode.

11. The semiconductor device according to claim 8, wherein
the semiconductor device includes a third sidewall insulating film on side walls of the first connection hole in which the first conductive film is arranged, and
side walls of the opening portion are covered with the third sidewall insulating film.

12. The semiconductor device according to claim 11, wherein
the first connection hole in which the first conductive film is arranged is arranged inside an interlayer insulating film which includes a stacked film formed of a first insulating film and a second insulating film arranged on the first insulating film, and
the third sidewall insulating film on the side walls of the opening portion is formed of the first insulating film.

13. The semiconductor device according to claim 2, wherein
the MISFET is an n-channel-type MISFET,
a conductivity type of the first semiconductor region is a p-type, and
a conductivity type of the second semiconductor region is an n-type.

14. The semiconductor device according to claim 2, wherein
the MISFET is an n-channel-type MISFET,
a conductivity type of the first semiconductor region is an n-type, and
a conductivity type of the second semiconductor region is a p-type.

15. The semiconductor device according to claim 14, wherein
a bottom portion of the element isolation region is arranged deeper than a bottom portion of the first semiconductor region.

16. The semiconductor device according to claim 13, wherein
the MISFET is a MISFET configuring an SRAM memory cell.

17. The semiconductor device according to claim 2, wherein
the MISFET is a p-channel-type MISFET,
a conductivity type of the first semiconductor region is an n-type, and
a conductivity type of the second semiconductor region is a p-type.

* * * * *

UNITED STATES PATENT AND TRADEMARK OFFICE
CERTIFICATE OF CORRECTION

| | | |
|---|---|---|
| PATENT NO. | : 9,024,386 B2 | Page 1 of 1 |
| APPLICATION NO. | : 13/678103 | |
| DATED | : May 5, 2015 | |
| INVENTOR(S) | : Katsuyuki Horita et al. | |

It is certified that error appears in the above-identified patent and that said Letters Patent is hereby corrected as shown below:

In the specification,

Column 1, Line 38: Delete "1109-266259)" and insert -- H09-266259) --

Column 1, Line 64: After "nMOS" insert -- 6 --

Column 15, Line 28: Delete "IL1" and insert -- IL1, --

Column 27, Line 7: Delete "Lot" and insert -- Lo1 --

Column 28, Line 11: Delete "(Acct," and insert -- (Acc1, --

Signed and Sealed this
Seventeenth Day of May, 2016

Michelle K. Lee
*Director of the United States Patent and Trademark Office*